(12) United States Patent
Won et al.

(10) Patent No.: US 12,396,109 B2
(45) Date of Patent: *Aug. 19, 2025

(54) DISPLAY DEVICE AND CONTROL METHOD OF DISPLAY DEVICE

(71) Applicant: SAMSUNG DISPLAY CO., LTD., Yongin-si (KR)

(72) Inventors: Byeonghee Won, Yongin-si (KR); Jungtae Park, Yongin-si (KR); Jangyeol Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/413,170

(22) Filed: Jan. 16, 2024

(65) Prior Publication Data

US 2024/0188237 A1    Jun. 6, 2024

Related U.S. Application Data

(63) Continuation of application No. 17/533,496, filed on Nov. 23, 2021, now Pat. No. 11,895,790.

(30) Foreign Application Priority Data

Apr. 27, 2021    (KR) .......................... 10-2021-0054631

(51) Int. Cl.
*H05K 5/02*        (2006.01)
*H05K 5/00*        (2006.01)

(52) U.S. Cl.
CPC ......... *H05K 5/0217* (2013.01); *H05K 5/0017* (2013.01)

(58) Field of Classification Search
CPC .......................... H05K 5/0017; H05K 5/0217
USPC ......................... 361/807, 809, 810
See application file for complete search history.

(56) References Cited

U.S. PATENT DOCUMENTS

| | | | |
|---|---|---|---|
| 9,119,303 B2 | 8/2015 | Baik et al. | |
| 10,181,575 B2 | 1/2019 | Lee et al. | |
| 11,895,790 B2 * | 2/2024 | Won | G09F 9/301 |
| 2014/0226266 A1 | 8/2014 | Kang et al. | |
| 2014/0268584 A1 | 9/2014 | Song et al. | |
| 2015/0220120 A1 * | 8/2015 | Lee | G06F 3/045 |
| | | | 345/173 |
| 2016/0249475 A1 * | 8/2016 | Park | G02F 1/133308 |
| 2019/0140025 A1 * | 5/2019 | Wang | H05K 1/028 |
| 2020/0035061 A1 | 1/2020 | Froy | |
| 2020/0203441 A1 * | 6/2020 | Zhao | H10K 59/173 |

FOREIGN PATENT DOCUMENTS

| | | | | |
|---|---|---|---|---|
| KR | 101401196 B1 | 5/2014 | | |
| KR | 20140117182 A | * 10/2014 | ............... | G09F 9/00 |
| KR | 102008763 B1 | 8/2019 | | |
| KR | 1020200124461 A | 11/2020 | | |

* cited by examiner

*Primary Examiner* — Hung S. Bui
(74) *Attorney, Agent, or Firm* — CANTOR COLBURN LLP

(57) ABSTRACT

A display device includes: a display panel which displays an image; and a frame set disposed on a rear side of the display panel, where the frame set bends the display panel. The frame set includes a frame including a body extending in a longitudinal direction and a head protruding toward the rear side of the display panel from the body, and a wire fixed to the head and extending in a longitudinal direction of the frame.

10 Claims, 32 Drawing Sheets

DISPLAY DEVICE AND CONTROL METHOD OF DISPLAY DEVICE

CROSS-REFERENCE TO RELATED APPLICATION

This application is a continuation of U.S. patent application Ser. No. 17/533,496, filed on Nov. 23, 2021, which claims priority to Korean Patent Application No. 10-2021-0054631, filed on Apr. 27, 2021, and all the benefits accruing therefrom under 35 U.S.C. § 119, the content of which in its entirety is herein incorporated by reference.

BACKGROUND

1. Field

One or more embodiments relate to a display device and a control method of the display device.

2. Description of the Related Art

Display devices may provide images to a user using a display panel. In a case where the display device is a curved television ("TV"), the display device may provide an image to a user through a concavely bent display panel so that a distance from the user's eyes to the center of the screen and to both sides of the screen is constant. In this case, a three-dimensional effect of the image may increase. Thus, the user's immersion in watching the image increases, and the user's eye fatigue may be reduced.

SUMMARY

In a case where a display device is a curved television ("TV"), the curved TV may occupy a large space, and the user may experience a screen distortion phenomenon depending on the position at which the user watches the curved TV. In addition, when a plurality of users watch the curved TV, users other than users positioned in the center of curvature of the curved TV may experience a screen distortion phenomenon.

One or more embodiments include a display device for controlling a shape of a display panel such that the display panel is bent in various ways, and a control method of the display device.

According to an embodiment, a display device includes a display panel which displays an image, and a frame set disposed on a rear side of the display panel, where the frame set bends the display panel. In such an embodiment, the frame set includes a frame including a body extending in a longitudinal direction and a head protruding toward the rear side of the display panel from the body, and a wire fixed to the head and extending in a longitudinal direction of the frame.

In an embodiment, the frame may further include a protrusion pattern protruding toward the rear side of the display panel from the body, the protrusion pattern may be apart from the head in the longitudinal direction of the frame, a through hole may be defined through the protrusion pattern, and the wire may extend through the through hole.

In an embodiment, the frame set may further include an intermediate frame disposed between the frame and the display panel, where the intermediate frame may extend in the longitudinal direction of the frame, and may move relative to the head. In such an embodiment, one of the head and the intermediate frame may include a concave portion facing the other one of the head and the intermediate frame, and the other one of the head and the intermediate frame may include a convex portion facing the concave portion.

In an embodiment, the wire may be disposed between the display panel and the body.

In an embodiment, the display panel may include a first edge extending in a first direction, and a second edge extending in a second direction crossing the first direction, the frame set may include a plurality of frame sets, the plurality of frame sets may include a first frame set extending in the first direction, and a second frame set extending in the second direction, and the first frame set and the second frame set may bend the display panel in a way such that each of the first edge and the second edge has a curvature.

In an embodiment, the display device may further include a plurality of supporters which supports the display panel and is arranged side by side in the second direction, and the first frame set may bend the plurality of supporters, and the second frame set may move at least one selected from the plurality of supporters in a third direction crossing the first direction and the second direction.

In an embodiment, the plurality of supporters may include a first supporter and a second supporter adjacent to each other, and the first supporter and the second supporter may be connected to each other.

In an embodiment, an extension direction of each of the plurality of supporters may be changed at least twice.

In an embodiment, the display panel may include a central display area, and a corner display area disposed between the central display area and a corner where the first edge and the second edge meet, and when the display panel is bent, the corner display area may be bent from the first direction to a third direction crossing the first direction and the second direction, and may be bent from the second direction to the third direction.

In an embodiment, In an embodiment, the display device may further include a controller which adjusts a length of the wire, and the frame may be bent when the length of the wire decreases.

According to an embodiment, a control method of a display device includes displaying an image by a display panel of the display device, and bending the display panel by bending a frame set of the display device, where the frame set is disposed on a rear side of the display panel, the frame set includes a frame including a body extending in a longitudinal direction, and a head protruding to the rear side of the display panel from the body, and a wire fixed to the head and extending in a longitudinal direction of the frame, and the frame is bent by adjusting a length of the wire.

In an embodiment, the frame set may further include an intermediate frame disposed between the frame and the display panel and extending in the longitudinal direction of the frame, and the intermediate frame may move relative to the head when the frame is bent.

In an embodiment, one of the head and the intermediate frame may include a concave portion facing the other one of the head and the intermediate frame, the other one of the head and the intermediate frame may include a convex portion facing the concave portion, and, when the frame is bent, the convex portion may move relative to the concave portion in the concave portion.

In an embodiment, the display panel may include a first edge extending in a first direction, and a second edge extending in a second direction crossing the first direction, the frame set may include a plurality of frame sets, the plurality of frame sets may include a first frame set extending in the first direction, and a second frame set extending in the second direction, and the bending the display panel may include bending the display panel by bending at least one selected from the first frame set and the second frame set.

In an embodiment, the first frame set and the second frame set may bend the display panel in a way such that each of the first edge and the second edge has a curvature.

In an embodiment, the method may further include bending a plurality of supporters of the display device by bending the first frame set, where the plurality of supporters may support the display panel and be arranged side by side in the second direction.

In an embodiment, the method may further include moving at least one selected from a plurality of supporters in a third direction crossing the first direction and the second direction by bending the second frame set, where the plurality of supporters may support the display panel and be arranged side by side in the second direction.

In an embodiment, the display panel may include a central display area, and a corner display area disposed between the central display area and a corner where the first edge and the second edge meet, and the bending the display panel may include bending the corner display area from the first direction to a third direction crossing the first direction and the second direction, and bending the corner display area from the second direction to the third direction.

In an embodiment, the corner display area may include a first corner display area and a second corner display area. In such an embodiment, when the display panel is bent, the first corner display area may have a first-direction first-curvature in a cross-section in the first direction, and a second-direction first-curvature in a cross-section in the second direction, and when the display panel is bent, the second corner display area may have a first-direction second-curvature in a cross-section in the first direction, and a second-direction second-curvature in a cross-section in the second direction. In such an embodiment, the first-direction first-curvature may be different from the first-direction second-curvature.

In an embodiment, the method may further include obtaining information for bending the display panel, and the display panel may be bent in a shape corresponding to the information.

BRIEF DESCRIPTION OF THE DRAWINGS

The above and other features of certain embodiments will be more apparent from the following description taken in conjunction with the accompanying drawings, in which.

DETAILED DESCRIPTION

Figure 1:
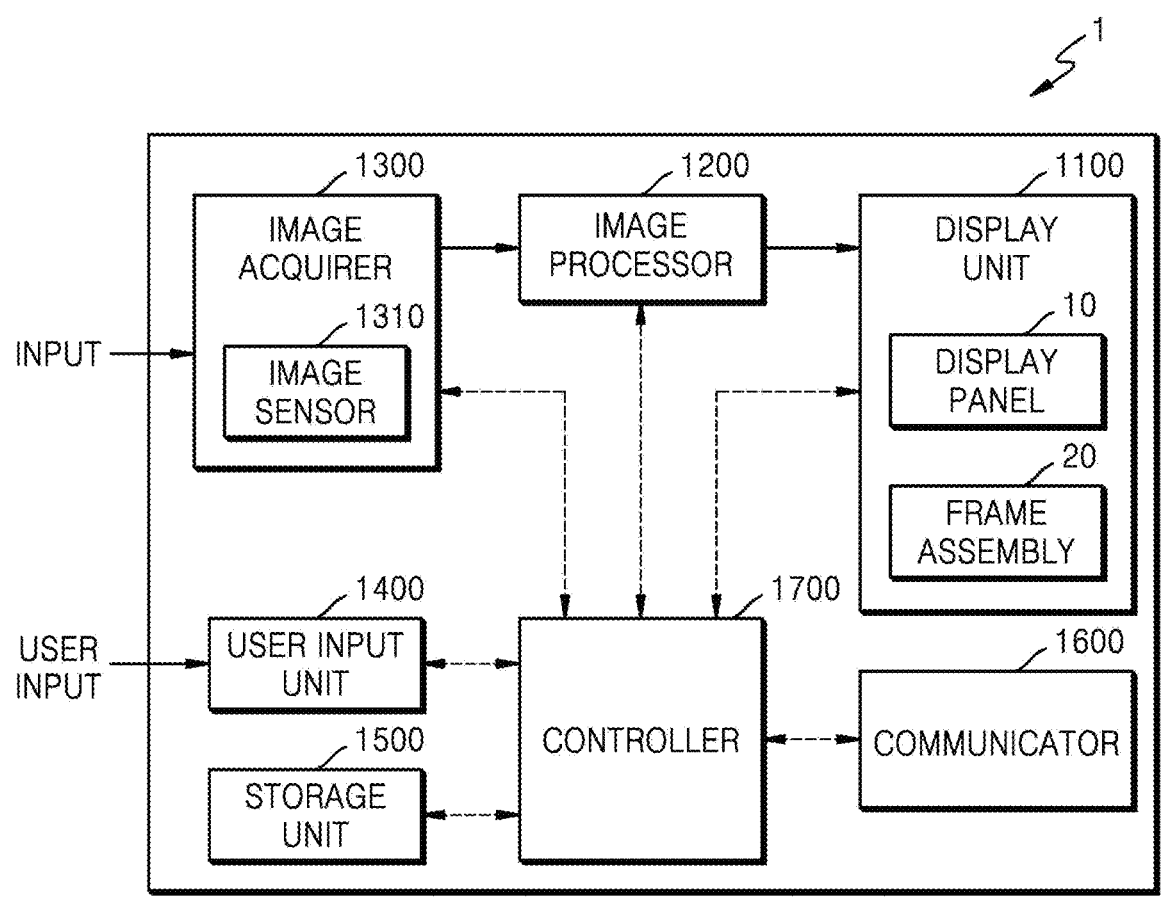
FIG. 1 is a block diagram illustrating a configuration of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region,"

"layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "at least one of" has the same meaning as "at least one selected from." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Display devices may include a device for displaying moving images or still images, and may be used as a display screen of various products including televisions ("TV"s), laptop computers, monitors, billboards, Internet of things ("IoT") as well as portable electronic devices including mobile phones, smart phones, tablet personal computers ("PC"s), mobile communication terminals, electronic organizers, electronic books, portable multimedia players ("PMP"s), navigations, and ultra-mobile PCs ("UMPC"s). In addition, the display device according to an embodiment may be used in wearable devices, such as smart watches, watch phones, glasses-type displays, and head-mounted displays ("HMD"s). In addition, the display device may be used as instrument panels for automobiles, center fascias for automobiles, or center information displays ("CID"s) arranged on a dashboard, room mirror displays that replace side-view mirrors of automobiles, and displays arranged on the rear side of front seats as entertainment for rear seats of automobiles.

Hereinafter, embodiments of the invention will be described in detail with reference to the accompanying drawings.

FIG. 1 is a block diagram of a configuration of a display device 1 according to an embodiment.

Referring to FIG. 1, an embodiment of the display device 1 may include a display unit 1100, an image processor 1200, an image acquirer 1300, a user input unit 1400, a storage unit 1500, a communicator 1600, and a controller 1700.

The display unit 1100 may display images. In an embodiment, the display unit 1100 may display images based on an image signal processed by the image processor 1200. In an embodiment, the display unit 1100 may display digital images. The display unit 1100 may include a display panel 10 and a frame assembly 20. The display panel 10 may display images. The frame assembly 20 may be connected to the display panel 10. In an embodiment, the frame assembly 20 may be bent in various shapes such that the display panel 10 may be bent in various shapes.

In an embodiment, the display unit 1100 may display information about a communication interface supported by the communicator 1600. The controller 1700 may control the display unit 1100 to display, on the display panel 10, the communication interface information stored in the storage unit 1500.

The image processor 1200 may process image signals received from the outside. The image processor 1200 may perform various preset image processing on the image signals. The image processor 1200 may output image signals on which such a process is performed to the display unit 1100, thereby displaying an image on the display panel 10.

The image processor 1200 may include an image receiver (not shown) for receiving image signals from the outside.

The image receiver may be implemented in various ways corresponding to a specification of a received image signal and an implementation form of the display device 1. In one embodiment, for example, the image processor 1200 may wirelessly receive radio frequency ("RF") signals received from a broadcasting station (not shown), or may receive, by wire, image signals by composite video, component video, super video, SCART, a high definition multimedia interface ("HDMI") specification, or the like. When the image signals are broadcast signals, the image processor 1200 may include a tuner for tuning the broadcasting signals for each channel.

In an alternative embodiment, an image signal may be received from an external device. In one embodiment, for example, the image signal may be received from an external device such as PCs, audio/video ("AV") devices, smart phones, smart pads, or the like. In another alternative embodiment, the image signal may be from data received via a network such as the Internet. In such an embodiment, the display device 1 may perform a network communication via the communicator 1600. In another alternative embodiment, the image signal may be from data stored in the storage unit 1500 that is non-volatile, such as flash memory, hard disk, or the like. The storage unit 1500 may be provided inside or outside of the display device 1. In an embodiment, where the storage unit 1500 is provided outside of the display device 1, the display device 1 may further include a connection unit (not shown) to which the storage unit 1500 is connected.

Types of an image processing performed by the image processor 1200 are not limited. In one embodiment, for example, the types of image processing performed by the image processor 1200 may include at least one selected from decoding, de-interlacing, frame refresh rate conversion, scaling, noise reduction for image quality improvement, detail enhancement, and line scanning corresponding to various image formats. The image processor 1200 may be implemented as a group of individual elements capable of independently performing each process, or may be implemented as a system-on-chip ("SoC") for integrating various functions.

The image acquirer 1300 may obtain an external image by photographing an external environment. The image acquirer 1300 may include an image acquisition unit. In an embodiment, the image acquirer 1300 may be implemented as a camera for photographing an external environment. In such an embodiment, the camera may be installed at a certain position of the display device 1. In one embodiment, for example, the camera may be installed above the display device 1, or may be installed inside the display device 1. An installation position of the camera is not limited, and the camera may be separated from a main body of the display device 1 and installed outside of the display device 1 as necessary.

The image acquirer 1300 may include a lens (not shown) through which an image passes through, and an image sensor 1310 for detecting the image passing through the lens. The image sensor 1310 may be implemented as a charge-coupled device ("CCD") image sensor or a complementary metal-oxide-semiconductor ("CMOS") image sensor. An image received via the image acquirer 1300 may be processed by the image processor 1200.

The user input unit 1400 may receive an input of a user. The user input unit 1400 may transfer various preset control commands or non-limiting information to the controller 1700 by a user's manipulation or input.

In an embodiment, the user input unit 1400 may receive an input signal from an input device provided in the main body of the display device 1 or apart from the display device 1. In one embodiment, for example, the user input unit 1400 may receive the input signal through a keypad and/or an input panel (not shown) including buttons provided in the main body of the display device 1, such as number keys and/or menu keys. The user input unit 1400 may receive an input signal via an input device that is separate and apart, such as a remote controller, a keyboard, and a mouse, for generating at least one selected from a preset command, data, information, and signal preset to remotely control the display device 1, and transmitting the same to the display device 1. In an embodiment, the input device that is separate and apart may include an external device connected to the main body of the display device 1 and capable of wireless communication, and the wireless communication may include an infrared communication, an RF communication, a wireless local area network ("WLAN"), etc. The input device may transmit a preset command to the display device 1 according to a user's manipulation. In an embodiment, the user input unit 1400 may receive a voice signal of a user.

Various data may be stored in the storage unit 1500. The storage unit 1500 may store non-limiting information under the control of the controller 1700. The storage unit 1500 may include at least one selected from a volatile memory and a non-volatile memory. The volatile memory may include at least one selected from a dynamic random access memory ("DRAM") and a static RAM ("SRAM"), and the non-volatile memory may include at least one selected from read only memory ("ROM"), programmable ROM ("PROM"), electrically programmable ROM ("EPROM"), electrically erasable and programmable ROM ("EEPROM"), flash memory, phase-change RAM ("PRAM"), magnetic RAM ("MRAM"), resistive RAM ("RRAM"), ferroelectric RAM ("FRAM"), a hard disk drive ("HDD"), and a solid state drive ("SSD").

The storage unit 1500 may be accessed by the controller 1700, and the storage unit 1500 may perform at least one of data reading, data writing, data correction, data deletion, and data updating. Data stored in the storage unit 1500 may include at least one selected from operation system data for driving of the display device 1, various applications executable on the operation system, image data, and additional data.

The storage unit 1500 may store a signal or data input and/or output to correspond to operations of each element, under the control of the controller 1700. The storage unit 1500 may store a control program for controlling the display device 1, a graphical user interface ("GUI") related to applications provided by the manufacturer or downloaded from an external source, images for providing the GUI, user information, documents, databases, or related data.

The communicator 1600 may perform wired and/or wireless communication with an external device. In an embodiment, the communicator 1600 may support at least one of wireless fidelity ("Wi-Fi")", Bluetooth®, RF, Zigbee®, WLAN, infrared communication, ultra-wideband ("UWB"), and near field communication ("NFC").

In an embodiment, the communicator 1600 may be built in the main body of the display device 1. In an alternative embodiment, the communicator 1600 may be implemented in a dongle form or a module form and be detachable from a connector (not shown) of the display device 1.

The controller 1700 may control the display device 1. The controller 1700 may control overall operations of the display device 1 and a flow of signals between internal elements of the display device 1. The controller 1700 may perform a data processing function. The controller 1700 may control a power supply from a power supply unit (not shown) to the internal elements. In an embodiment, when a user input or a set and stored condition is satisfied, the controller 1700 may execute an operation system ("OS") and various applications stored in the storage unit 1500.

The controller 1700 may obtain information for bending the display panel 10, bend the display panel 10 in a shape corresponding to the obtained information, and control the display panel 10 to display an image. In an embodiment, the controller 1700 may control the frame assembly 20 to bend the display panel 10.

Figure 2:
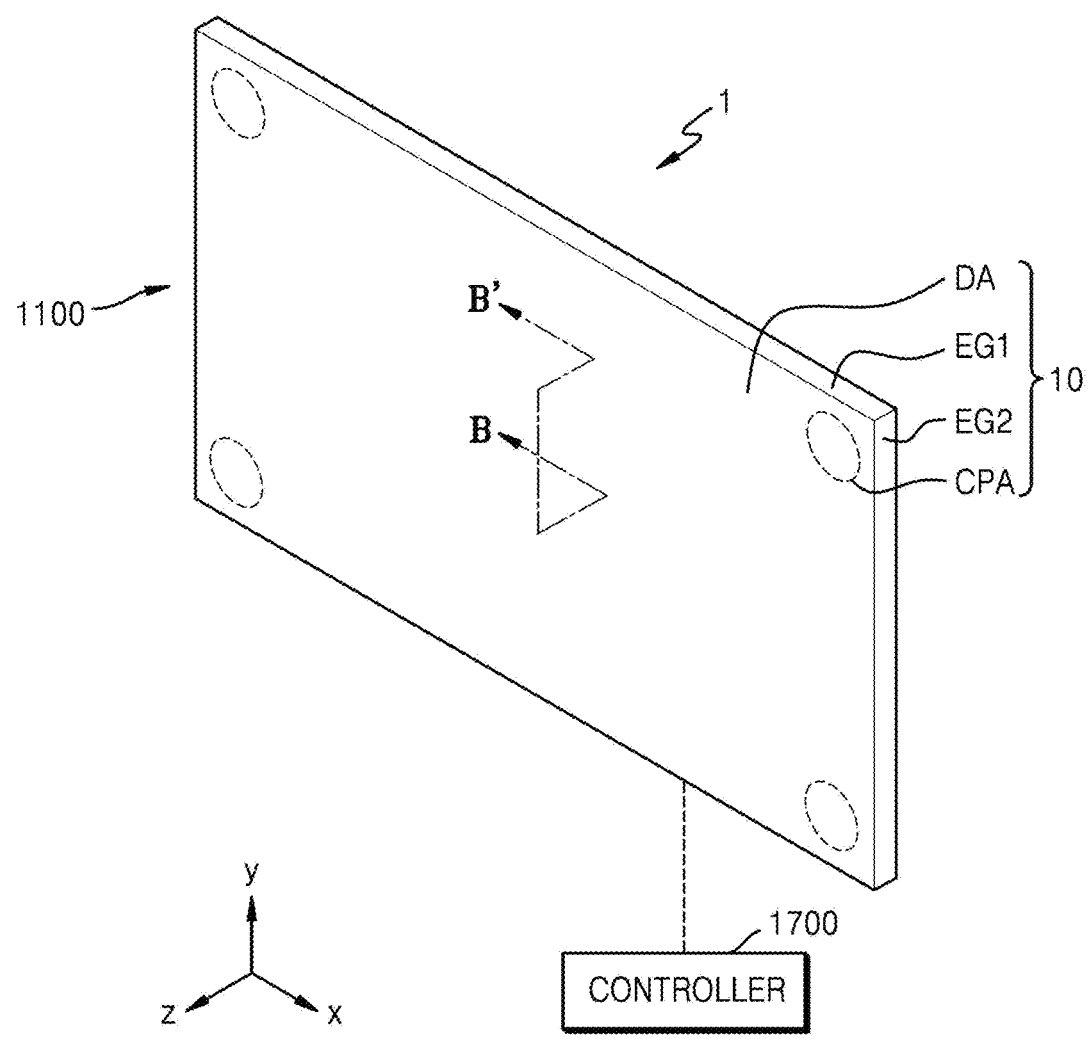
FIG. 2 is a perspective view schematically illustrating a display device according to an embodiment.

FIG. 2 is a perspective view schematically illustrating the display device 1 according to an embodiment. FIG. 2 is a perspective view showing a front surface of the display unit 1100.

Referring to FIG. 2, an embodiment of the display device 1 may include the display unit 1100 and the controller 1700. The display unit 1100 may include the display panel 10. The display panel 10 may display images.

The display panel 10 may include edges or side surfaces. The display panel 10 may include a first edge EG1 and a second edge EG2. Each of the first edge EG1 and the second edge EG2 may include an end of the display panel 10. In an embodiment, the first edge EG1 and the second edge EG2 may meet each other. In an embodiment, the first edge EG1 and the second edge EG2 may cross each other. In an embodiment, the first edge EG1 and the second edge EG2 may meet in a curved shape.

The first edge EG1 may extend in a first direction. The second edge EG2 may extend in a second direction. In such an embodiment, the first direction and the second direction may cross each other. In one embodiment, for example, the first direction and the second direction may form an acute angle, a right angle, or an obtuse angle with each other. Hereinafter, embodiments where the first direction is an x direction or a −x direction, and the second direction is a y direction or a −y direction will be mainly described in detail.

The display panel 10 may be bent. In an embodiment, the display panel 10 may be bent from the first direction (for example, the x direction or −x direction) to a third direction. The third angle may provide an acute angle, a right angle, or an obtuse angle with each of the first direction (for example, the x direction or the −x direction) and the second direction (for example, the y direction or the −y direction). In an embodiment, the third direction may be a z direction or a −z direction. That the display panel 10 is bent from the first direction (for example, the x direction or the −x direction) to the third direction (for example, the z direction or the −z direction) may mean that a cross-section of the display panel 10 crossing a plane (for example, a x-z plane) extending in the first direction (for example, the x direction or the −x direction) and the third direction (for example, the z direction or the −z direction) is bent in a concave or convex manner.

In an alternative embodiment, the display panel 10 may be bent from the second direction (for example, the y direction or the −y direction) to the third direction (for example, the z direction or the −z direction). That the display panel 10 is bent from the second direction (for example, the y direction or the −y direction) to the third direction (for example, the z direction or the −z direction) may mean that a cross-section of the display panel 10 crossing a plane (for example, a y-z plane) extending in the second direction (for example, the y direction or the −y direction) and the third direction (for example, the z direction or the −z direction) is bent in a concave or convex manner.

In another alternative embodiment, the display panel 10 may be bent from the first direction (for example, the x direction or the −x direction) to the third direction (for example, the z direction or the −z direction), and may be bent from the second direction (for example, the y direction or the −y direction) to the third direction (for example, the z direction or the −z direction). In such an embodiment, the display panel 10 may be stretched and/or contracted in the first direction (for example, the x direction or the −x direction) and/or the second direction (for example, the y direction or the −y direction). If the display panel 10 is not stretchable and/or contractable in the first direction (for example, the x direction or the −x direction) and/or the second direction (for example, the y direction or the −y direction), a relatively large stress may occur at a corner of the display panel 10, and thus, the display panel 10 may be damaged.

In an embodiment, the display panel 10 may include a stretchable display panel that may be stretched and/or contracted in the first direction (for example, the x direction or the −x direction) and/or the second direction (for example, the y direction or the −y direction). Thus, even when the display panel 10 is bent in various directions, a stress exerted on the display panel 10 may be relatively small, thereby effectively preventing or reducing damage to the display panel 10.

The display panel 10 may include a display area DA. The display area DA may display images. In an embodiment, the display panel 10 may display an image in the display area DA under the control of the controller 1700.

A pixel may be arranged in the display area DA. In an embodiment, a plurality of pixels may be arranged in the display area DA. The display panel 10 may provide an image using light emitted by the pixels. In an embodiment, the pixel may include a display element.

In an embodiment, the display panel 10 may include a component area CPA. The component area CPA may include an area in which components capable of assigning various functions to the display device 1 are arranged. In an embodiment, the components may include an image acquirer such as a sensor using light, a camera, or the like. The component area CPA may include a transmissive area, through which light of the sensor or light progressing toward the camera passes.

The component area CPA may be at least partially surrounded by the display area DA. In one embodiment, for example, the component area CPA may be entirely surrounded by the display area DA. In one alternative embodiment, for example, the component area CPA may only partially be surrounded by the display area DA.

In an embodiment, the component area CPA may be provided in plural. In an embodiment, the plurality of component areas CPA may be apart from one another in the first direction (for example, the x direction or the −x direction) and/or the second direction (for example, the y direction or the −y direction).

The component area CPA may be offset in the first direction (for example, the x direction or the −x direction) and/or the second direction (for example, the y direction or the −y direction) of the display panel 10 from a center of the display panel 10.

In an embodiment, the component area CPA may have a circular shape or an elliptical shape in a plan view (for example, on the x-y plane). In an alternative embodiment, the component area CPA may have a polygonal shape such as a quadrilateral shape in a plan view. In another alternative embodiment, the component area CPA may include a curved shape.

In an embodiment, a component (not shown) may overlap the component area CPA. In such an embodiment, the component may be arranged inside the display unit 1100. The component may include an electronic element using light or sound. In one embodiment, for example, the electronic element may include a sensor such as an infrared sensor that uses or receives light, a camera for receiving light to obtain an image, a sensor for outputting and sensing light or sound to measure a distance or recognize a fingerprint or the like, a miniature lamp for outputting light, or a speaker for outputting sound. An electronic element that uses light may use light in various wavelength bands, such as visible light, infrared light, and ultraviolet light.

In an embodiment, the component area CPA may be a transmissive area as a whole. In such an embodiment, the component area CPA may not display an image.

In an alternative embodiment, the component area CPA may display an image. In such an embodiment, a pixel may be arranged in at least a portion of the component area CPA, and at least a portion of the component area CPA in which the pixel is not arranged may include a transmissive area.

In another alternative embodiment, the component area CPA may be omitted. In such an embodiment, the component may be arranged outside of the display unit 1100. In one embodiment, for example, the component may be attached to the first edge EG1 and/or the second edge EG2.

Figure 3A:
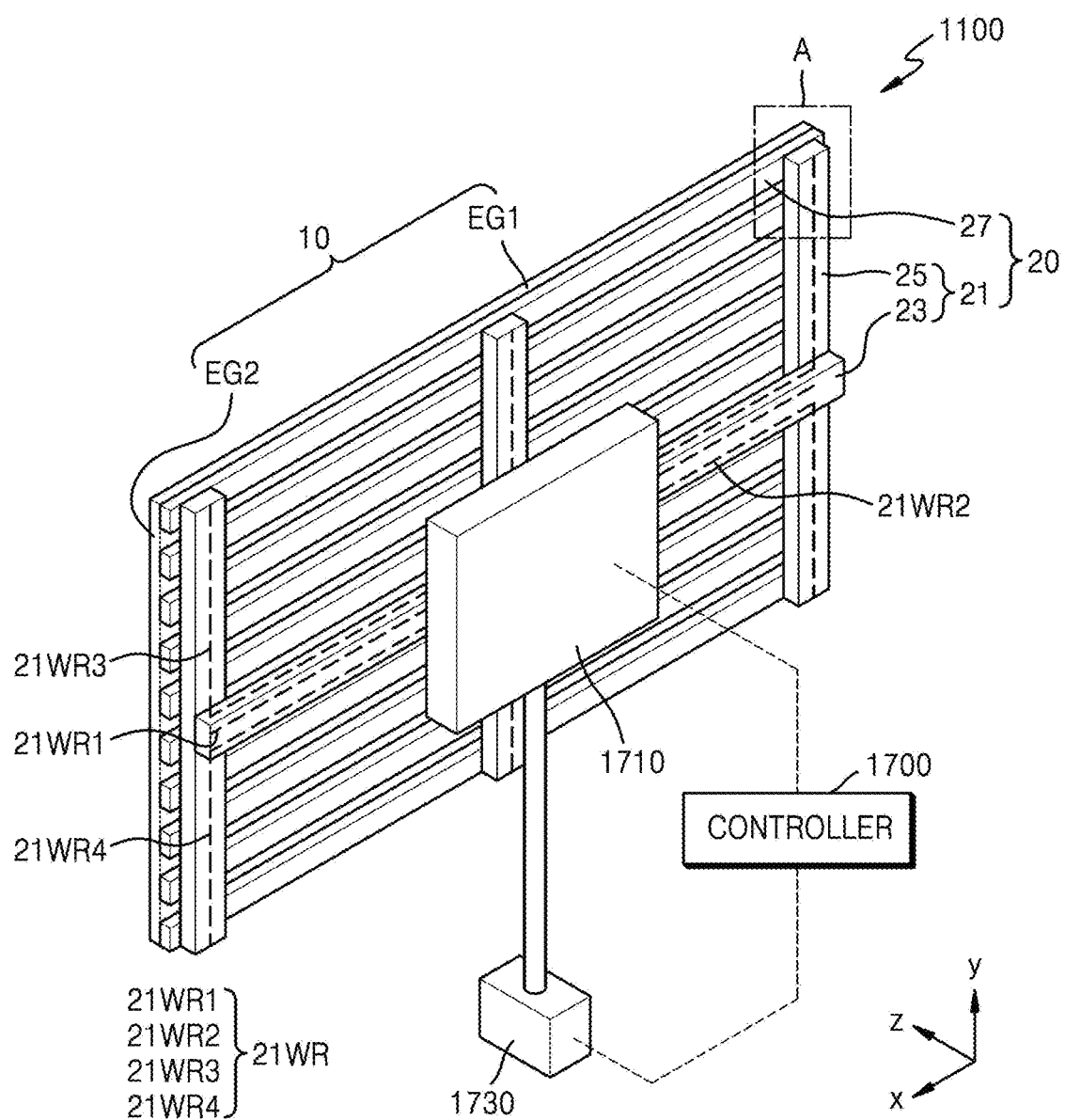
FIG. 3A is a perspective view schematically illustrating a display device according to an embodiment.

FIG. 3A is a perspective view schematically illustrating the display device according to an embodiment. FIG. 3A is a perspective view showing a rear surface of the display unit 1100.

Referring to FIG. 3A, an embodiment of the display device may include the display unit 1100 and the controller 1700. The display unit 1100 may include the display panel 10 and the frame assembly 20.

The frame assembly 20 may bend the display panel 10. The frame assembly 20 may be disposed or arranged on a rear side of the display panel 10. In such an embodiment, the frame assembly 20 may be arranged on an opposite side of the display area.

The frame assembly 20 may bend the display panel 10 to the third direction (for example, the z direction or the -z direction) crossing the first direction (for example, the x direction or the -x direction) and the second direction (for example, the y direction or the -y direction) from the first direction (for example, the x direction or the -x direction). Herein, bending an element from the first direction (for example, the x direction or the -x direction) to the third direction (for example, the z direction or the -z direction) may mean that a cross-section of the element crossing a plane (for example, the x-z plane) extending in the first direction (for example, the x direction or the -x direction) and the third direction (for example, the z direction or the -z direction) is bent in a concave or convex manner.

The first edge EG1 of the display panel 10 in a bent state may have a curvature. The first edge EG1 of the display panel 10 in a bent state may be bent from the first direction (for example, the x direction or the -x direction) to the third direction (for example, the z direction or the -z direction).

The frame assembly 20 may bend the display panel 10 from the second direction (for example, the y direction or the -y direction) to the third direction (for example, the z direction or the -z direction). Herein, bending an element from the second direction (for example, the y direction or the -y direction) to the third direction (for example, the z direction or the -z direction) may mean that a cross-section of the element crossing a plane (for example, the y-z plane) extending in the second direction (for example, the y direction or the -y direction) and the third direction (for example, the z direction or the -z direction) is bent in a concave or convex manner.

The second edge EG2 of the display panel 10 in a bent state may have a curvature. The second edge EG2 of the display panel 10 in a bent state may be bent from the second direction (for example, the y direction or the -y direction) to the third direction (for example, the z direction or the -z direction).

The frame assembly 20 may bend the display panel 10 from the first direction (for example, the x direction or the -x direction) to the third direction (for example, the z direction or the -z direction), and may bend the display panel 10 from the second direction (for example, the y direction or the -y direction) to the third direction (for example, the z direction or the -z direction). Thus, each of the first edge EG1 and the second edge EG2 of the display panel 10 in a bent state may have a curvature.

The frame assembly 20 may be controlled by the controller 1700. The frame assembly 20 may controlled by the controller 1700 so that the frame assembly 20 is bent from the first direction (for example, the x direction or the -x direction) to the third direction (for example, the z direction or the -z direction). The frame assembly 20 may controlled by the controller 1700 so that the frame assembly 20 is bent from the second direction (for example, the y direction or the -y direction) to the third direction (for example, the z direction or the -z direction). The frame assembly 20 may include a frame set 21 and a plurality of supporters 27.

The frame set 21 may bend the display panel 10. The frame set 21 may include a frame and a wire 21WR. The frame set 21 may be disposed or arranged on (e.g., connected to) a rear side of the display panel 10. The frame set 21 may bend the display panel 10 on the rear side of the display panel 10. In an embodiment, the frame set 21 may be provided in plural. In such an embodiment, the frame set 21 may include a plurality of frame sets 21.

The plurality of frame sets 21 may include a first frame set 23 and a second frame set 25. In an embodiment, the frame set 21 may include the first frame set 23 and the second frame set 25.

In an embodiment, the second frame set 25 may be arranged between the first frame set 23 and the display panel 10. In an embodiment, the first frame set 23 and the second frame set 25 may bend the display panel 10 so that each of the first edge EG1 and the second edge EG2 has a curvature.

The first frame set 23 may extend in the first direction (for example, the x direction or the -x direction). In an embodiment, as shown in FIG. 3A, a single first frame set 23 is disposed or arranged on the rear side of the display panel 10, but not being limited thereto. In an alternative embodiment, a plurality of first frame sets 23 may be provided on the rear side of the display panel 10.

The first frame set 23 may be bent from the first direction (for example, the x direction or the -x direction) to the third direction (for example, the z direction or the -z direction). The first frame set 23 may be bent under the control of the controller 1700. Thus, the first frame set 23 may bend the display panel 10 from the first direction (for example, the x direction or the -x direction) to the third direction (for example, the z direction or the -z direction). In addition, the first frame set 23 may bend the display panel 10 so that the first edge EG1 of the display panel 10 has a curvature.

The second frame set 25 may extend in the second direction (for example, the y direction or the -y direction). The second frame set 25 may be disposed or arranged on the rear side of the display panel 10. In an embodiment, the second frame set 25 may be provided in plural on the rear side of the display panel 10. In an alternative embodiment, a single second frame set 25 may be arranged on the rear side of the display panel 10.

The second frame set 25 may be bent from the second direction (for example, the y direction or the −y direction) to the third direction (for example, the z direction or the −z direction). The second frame set 25 may be bent under the control of the controller 1700. Thus, the second frame set 25 may bend the display panel 10 from the second direction (for example, the y direction or the −y direction) in the third direction (for example, the z direction or the −z direction). In addition, the second frame set 25 may bend the display panel 10 so that the second edge EG2 of the display panel 10 has a curvature.

In an embodiment, the first frame set 23 and the second frame set 25 may cross each other. In such an embodiment, the first frame set 23 and the second frame set 25 may be fixed to each other at a point where the first frame set 23 and the second frame set 25 cross each other.

In an embodiment, the wire 21WR may bend the frame set 21. In such an embodiment, the wire 21WR may bend the frame included in the frame set 21. In an embodiment, the controller 1700 may adjust a length of the wire 21WR. When the length of the wire 21WR decreases, the frame set 21 may be bent. In one embodiment, for example, when the wire 21WR is contracted or when the length of the wire 21WR is reduced by a motor, the frame set 21 may be bent.

In an embodiment, the wire 21WR may include a first wire 21WR1, a second wire 21WR2, a third wire 21WR3, and a fourth wire 21WR4. In an embodiment, a length of the first wire 21WR1, a length of the second wire 21WR2, a length of the third wire 21WR3, and a length of the fourth wire 21WR4 may be adjusted independent of each other.

The first wire 21WR1 and the second wire 21WR2 may bend a frame included in the first frame set 23. In an embodiment, the length of the first wire 21WR1 and the length of the second wire 21WR2 may be adjusted independent of each other. In such an embodiment, a degree of bending of the first frame set 23 extending in the −x direction and a degree of bending of the first frame set 23 extending in the x direction may be different from each other. In an embodiment, the third wire 21WR3 and the fourth wire 21WR4 may bend a frame included in the second frame set 25. In an embodiment, the length of the third wire 21WR3 and the length of the fourth wire 21WR4 may be adjusted independent of each other. In such an embodiment, a degree of bending of the second frame set 25 extending in the y direction and a degree of bending of the second frame set 25 extending in the −y direction may be different from each other.

The plurality of supporters 27 may support the display panel 10. The plurality of supporters 27 may be arranged between the display panel 10 and the frame set 21. The plurality of supporters 27 may be fixed to the frame set 21. In an embodiment, the plurality of supporters 27 may be arranged between the display panel 10 and the first frame set 23. In an embodiment, the plurality of supporters 27 may be arranged between the display panel 10 and the second frame set 25.

The plurality of supporters 27 may maintain a shape of the display panel 10. In an embodiment, the display panel 10 may include a stretchable display panel. In such an embodiment, the shape of the display panel 10 may be variously changed. The plurality of supporters 27 support the display panel 10, and thus, the shape of the display panel 10 may be maintained.

In an embodiment, the plurality of supporters 27 may be arranged side by side in the second direction (for example, the y direction or the −y direction). In one embodiment, for example, the plurality of supporters 27 may be apart from each other in the second direction (for example, the y direction or the −y direction). In an alternative embodiment, the plurality of supporters 27 may be arranged side by side in the first direction (for example, the x direction or the −x direction). In one embodiment, for example, the plurality of supporters 27 may be apart from each other in the first direction (for example, the x direction or the −x direction). Hereinafter, for convenience of description, embodiments where the plurality of supporters 27 are arranged side by side in the second direction (for example, the y direction or the −y direction) will be mainly described in detail.

In an embodiment, the supporter 27 may include austenitic stainless steels. The supporter 27 may include (e.g., be manufactured using) stainless steel, invar, nickel (Ni), cobalt (Co), a Ni alloy, a Ni—Co alloy, or the like. In an alternative embodiment, the supporter 27 may include at least one selected from various metal materials. In another alternative embodiment, the supporter 27 may include a polymer compound, for example, a polymer.

The plurality of supporters 27 may be bent. In an embodiment, the first frame set 23 may bend the plurality of supporters 27. The plurality of supporters 27 may be bent from the first direction (for example, the x direction or the −x direction) to the third direction (for example, the z direction or the −z direction). In an embodiment, the first frame set 23 may bend the plurality of supporters 27 from the first direction (for example, the x direction or the −x direction) to the third direction (for example, the z direction or the −z direction). In one embodiment, for example, when the first frame set 23 is bent from the first direction (for example, the x direction or the −x direction) to the third direction (for example, the z direction or the −z direction), the plurality of supporters 27 may also be bent from the first direction (for example, the x direction or the −x direction) to the third direction (for example, the z direction or the −z direction). Thus, the display panel 10 may be bent from the first direction (for example, the x direction or the −x direction) to the third direction (for example, the z direction or the −z direction).

At least one selected from the plurality of supporters 27 may move in the third direction (for example, the z direction or the −z direction). In one embodiment, for example, the supporter 27 arranged adjacent to the first edge EG1 among the plurality of supporters 27 may move in the third direction (for example, the z direction or the −z direction). In an embodiment, the second frame set 25 may move the at least one of the plurality of supporters 27 in the third direction (for example, the z direction or the −z direction). In one embodiment, for example, when the second frame set 25 is bent from the second direction (for example, the y direction or the −y direction) to the third direction (for example, the z direction or the −z direction), the at least one selected from the plurality of supporters 27 may move in the third direction (for example, the z direction or the −z direction). Thus, the display panel 10 may be bent from the second direction (for example, the y direction or the −y direction) to the third direction (for example, the z direction or the −z direction).

The controller 1700 may obtain information for bending the display panel 10, and bend the display panel 10 based on the obtained information. The controller 1700 may include a first driving unit 1710 and a second driving unit 1730.

The first driving unit 1710 may control the frame assembly 20. In an embodiment, the first driving unit 1710 may control bending of the frame set 21. In an embodiment, the first driving unit 1710 may include a motor. The motor may reduce the length of the wire 21WR by contracting the wire 21WR or by winding the wire 21WR.

In an embodiment, the first driving unit 1710 may include a plurality of motors. The plurality of motors may control bending of each of the first frame set 23 and the second frame set 25. In an embodiment, the plurality of motors may control bending of one frame set 21. In one embodiment, for example, where the plurality of motors control the first frame set 23, bending of both ends of the first frame set 23 may be adjusted independent of each other. The plurality of motors may adjust the length of the first wire 21WR1 and the length of the second wire 21WR2. In one alternative embodiment, for example, where the plurality of motors control the second frame set 25, bending of both ends of the second frame set 25 may be adjusted independent of each other. The plurality of motors may adjust the length of the third wire 21WR3 and the length of the fourth wire 21WR4. Thus, the display panel 10 may be bent in various shapes.

In an embodiment, the first driving unit 1710 may be arranged on the rear side of the display unit 1100. In such an embodiment, the first driving unit 1710 may include a fixing member for fixing the display unit 1100 onto an external wall surface or the like. In one embodiment, for example, the fixing member may include a bracket.

The second driving unit 1730 may control the display unit 1100 to rotate with the second direction (for example, the y direction or the −y direction) as an axis. In an embodiment, the second driving unit 1730 may include a motor. The motor may rotate the display unit 1100 with the second direction (for example, the y direction or the −y direction) as an axis. Accordingly, by the controller 1700, the display panel 10 may rotate with the second direction (for example, the y direction or the −y direction) as an axis.

Figure 3B:
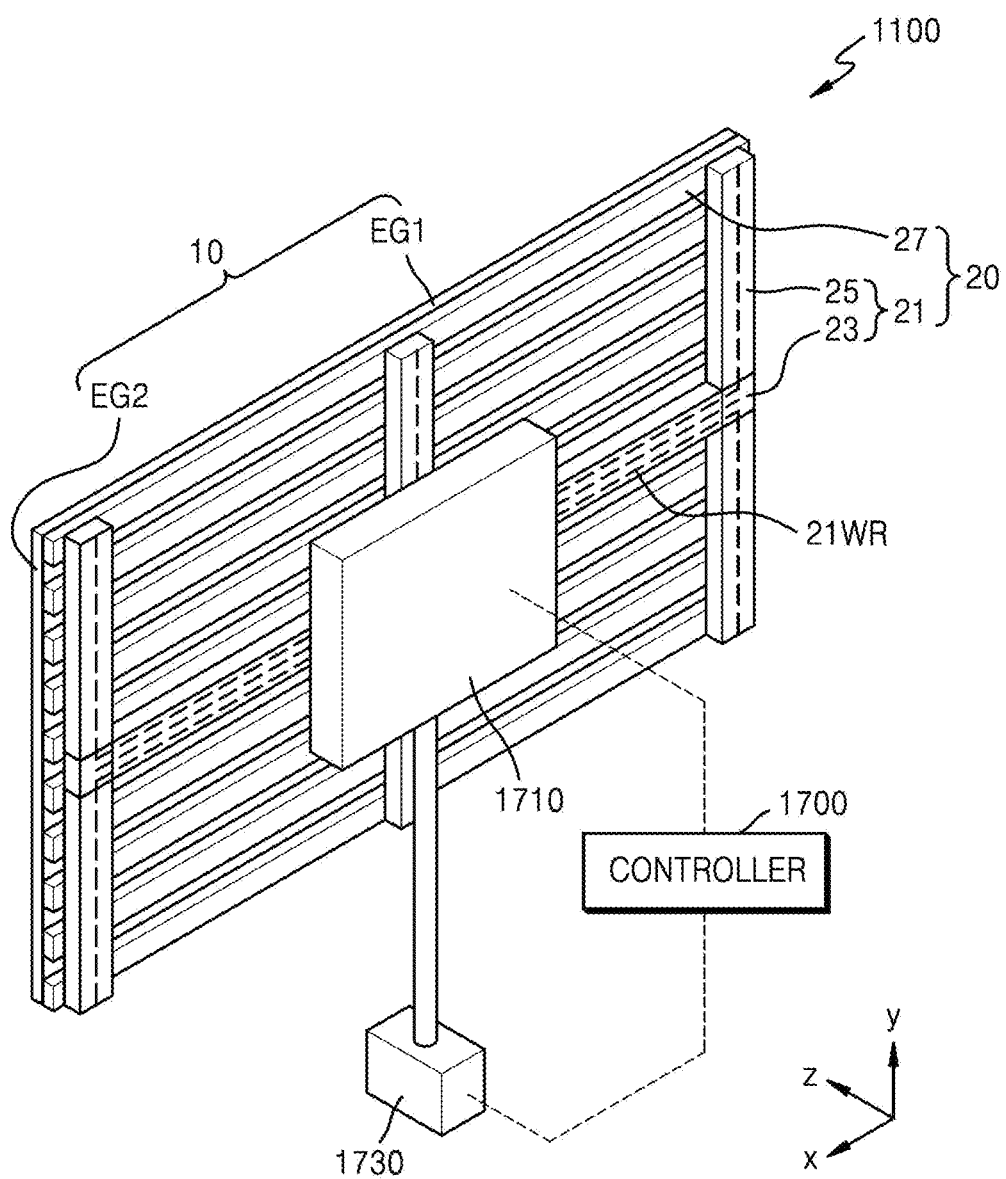
FIGS. 3B, 3C, and 3D are perspective views schematically illustrating a display device according to various embodiments.
Figure 3C:
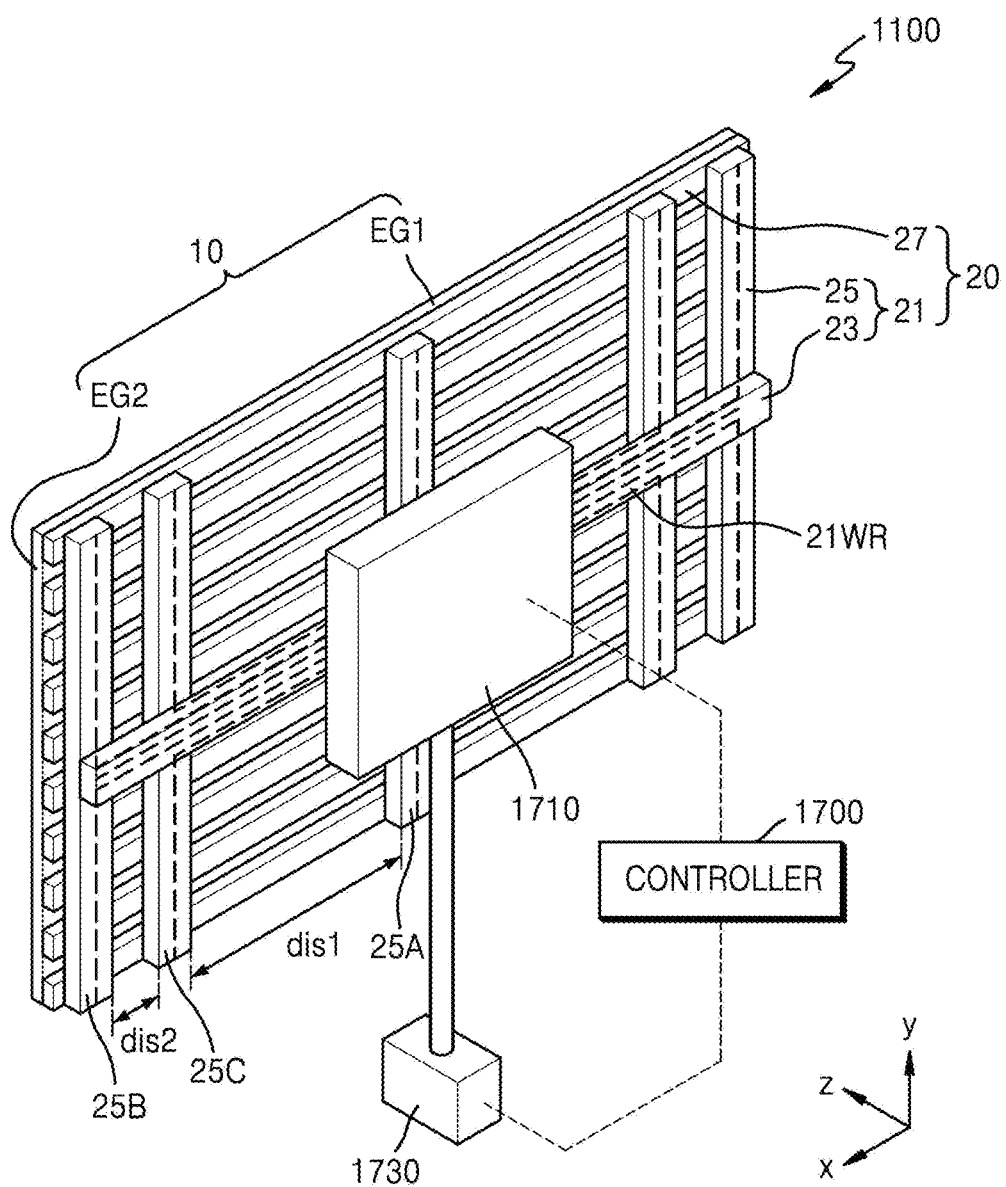
Figure 3D:
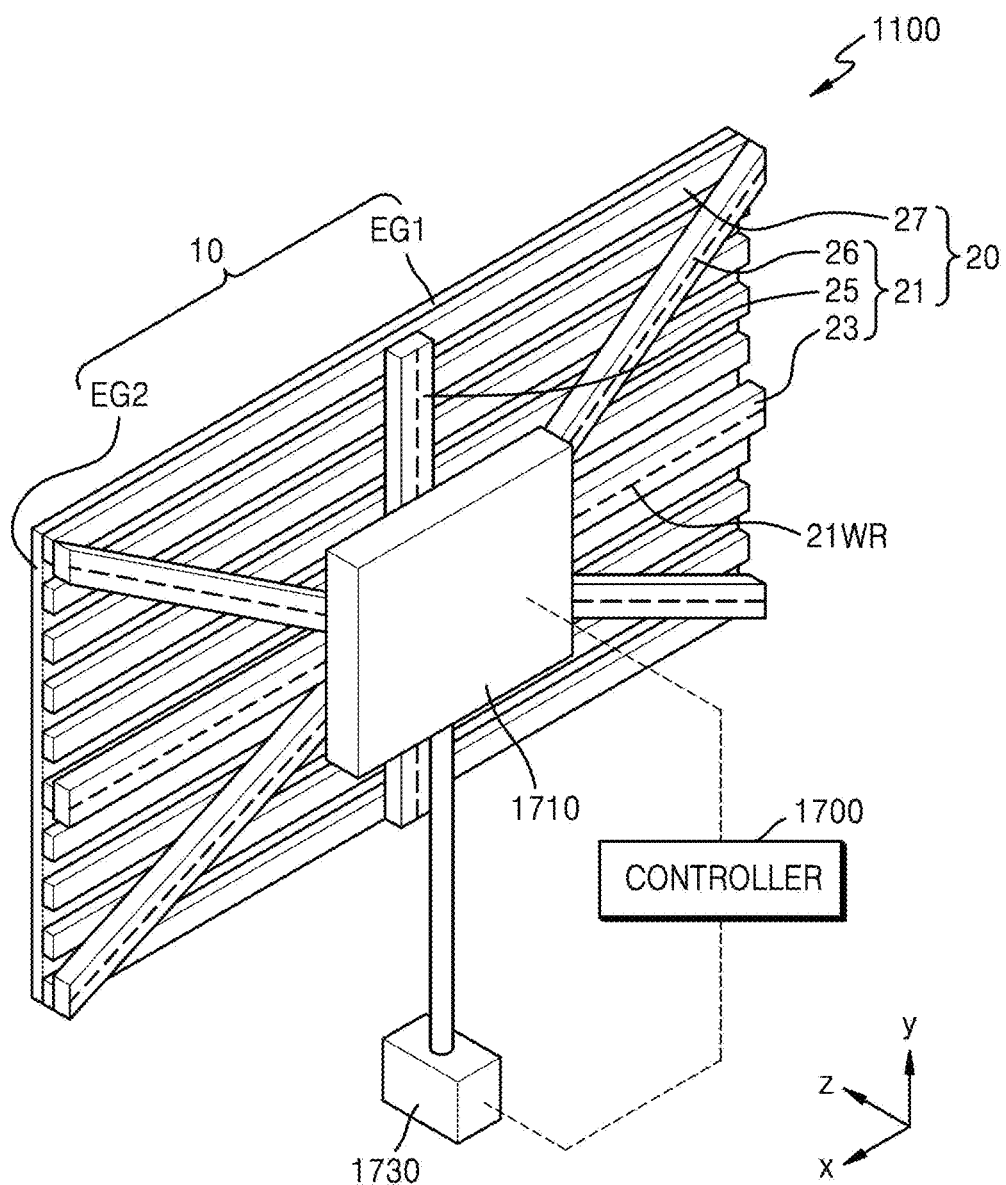

FIGS. 3B, 3C, and 3D are perspective views schematically illustrating the display device according to various embodiments. FIGS. 3A, 3B, and 3C are perspective views showing a rear surface of the display unit 1100. In FIGS. 3B, 3C, and 3D, the same or like reference numerals as those of FIG. 3A denote the same or like elements, and any repetitive detailed descriptions thereof will be omitted.

Referring to FIGS. 3B, 3C, and 3D, an embodiment of the display device may include the display unit 1100 and the controller 1700. The display unit 1100 may include the display panel 10 and the frame assembly 20. The frame assembly 20 may include the frame set 21 and the plurality of supporters 27. In an embodiment, the frame set 21 may include a plurality of frame sets 21.

Referring to FIG. 3B, in an embodiment, the plurality of frame sets 21 may include the first frame set 23 and the second frame set 25. In an embodiment, the first frame set 23 and the second frame set 25 may be integrally formed with each other as a single unitary body.

Referring to FIG. 3C, in an alternative embodiment, the plurality of frame sets 21 may include the first frame set 23 and the second frame set 25. In an embodiment, the second frame set 25 may include a central frame set 25A, an edge frame set 25B, and an intermediate frame set 25C. In an embodiment, the central frame set 25A may overlap a center of the display panel 10. The edge frame set 25B may be adjacent to the second edge EG2. The intermediate frame set 25C may be arranged between the central frame set 25A and the edge frame set 25B. In an embodiment, as shown in FIG. 3C, a single intermediate frame set 25C may be provided, but not being limited thereto. In an alternative embodiment, a plurality of intermediate frame set 25C may be provided.

In an embodiment, a first distance dis1 between the central frame set 25A and the intermediate frame set 25C may be greater than a second distance dis2 between the intermediate frame set 25C and the edge frame set 25B. The first distance dis1 may include a distance between the central frame set 25A and the intermediate frame set 25C in the first direction (for example, the x direction or the −x direction). The second distance dis2 may include a distance between the intermediate frame set 25C and the edge frame set 25B in the first direction (for example, the x direction or the −x direction). In such an embodiment, a bending force exerted on a corner of the display panel 10 may increase.

Referring to FIG. 3D, in another alternative embodiment, the plurality of frame sets 21 may include the first frame set 23, the second frame set 25, and a third frame set 26. The third frame set 26 may extend in a direction crossing the first direction (for example, the x direction or the −x direction) and the second direction (for example, the y direction or the −y direction). In an embodiment, the third frame set 26 may extend toward the corner of the display panel 10 from the center of the display panel 10. In an embodiment, the third frame set 26 may be provided in plural. The third frame set 26 may bend the display panel 10 so that each of the first edge EG1 and the second edge EG2 has a curvature. In such an embodiment, at least one selected from the first frame set 23 and the second frame set 25 may be omitted.

Figure 4:
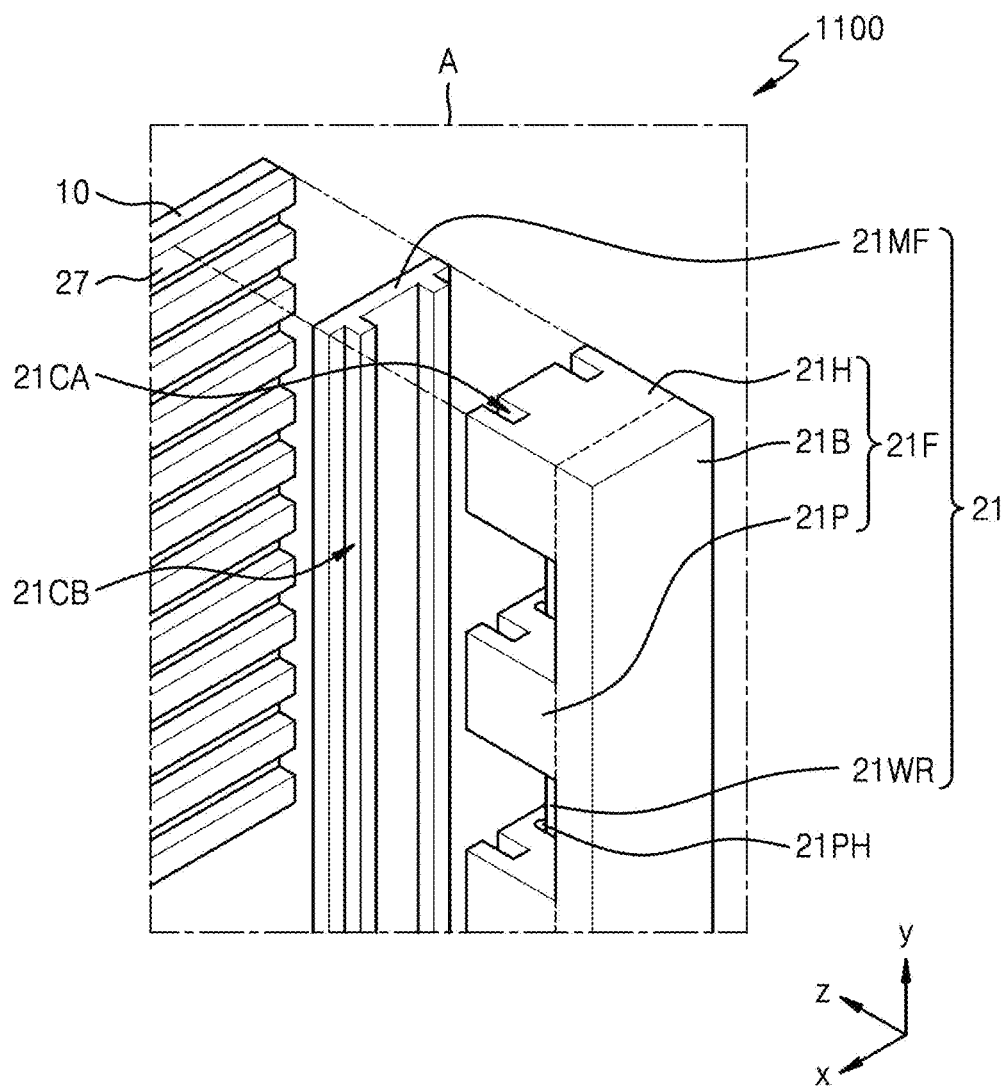
FIG. 4 is an exploded view of region A of a display unit in FIG. 3A.

FIG. 4 is an exploded view of region A of the display unit 1100 in FIG. 3A. In FIG. 4, the same or like reference numerals as those of FIG. 3A denote the same or like elements, and any repetitive detailed descriptions thereof will be omitted.

Referring to FIG. 4, an embodiment of the display unit 1100 may include the display panel 10 and the frame set 21. The display panel 10 may display images. The frame set 21 may be disposed or arranged on the rear side of the display panel 10 and bend the display panel 10. The frame set 21 may include a frame 21F, the wire 21WR, and an intermediate frame 21MF. The frame set 21 may include the first frame set 23 in FIG. 3A and/or the second frame set 25 in FIG. 3A.

The frame 21F is bendable, and the frame 21F may bend the display panel 10. The frame 21F may include a body 21B, a head 21H, and a protrusion pattern 21P. The body 21B may extend in a longitudinal direction. In one embodiment, for example, the body 21B may extend in the second direction (for example, the y direction or the −y direction). In one alternative embodiment, for example, the body 21B may extend in the first direction (for example, the x direction or the −x direction). The body 21B may have a fixed point. The fixed point may include a point where a portion of the body 21B is fixed relative to the head 21H. The head 21H may protrude in a direction crossing the longitudinal direction of the body 21B. In an embodiment, the head 21H may protrude toward the rear side of the display panel 10 from the body 21B. In one embodiment, for example, the head 21H may protrude in a z direction in FIG. 4.

The protrusion pattern 21P may protrude in a direction crossing the longitudinal direction of the body 21B. In an embodiment, the protrusion pattern 21P may protrude toward the rear side of the display panel 10. In one embodiment, for example, the protrusion pattern 21P may protrude in the z direction in FIG. 4. The protrusion pattern 21P may be apart from the head 21H in a longitudinal direction of the frame 21F. In one embodiment, for example, the protrusion pattern 21P may be apart from the head 21H in a y direction in FIG. 4.

In an embodiment, a through hole 21PH may be defined through the protrusion pattern 21P. The through hole 21PH may penetrate through the protrusion pattern 21P in the longitudinal direction of the frame 21F. In one embodiment, for example, the through hole 21PH in FIG. 4 may penetrate through the protrusion pattern 21P in the y direction. In such an embodiment, the wire 21WR may penetrate and extend through the through hole 21PH. In an embodiment, the frame 21F may have one protrusion pattern 21P. In an alternative embodiment, the frame 21F may include the plurality of protrusion patterns 21P.

In an embodiment, the frame 21F may include austenitic stainless steels. In an alternative embodiment, the frame 21F may include stainless steel, invar, nickel (Ni), cobalt (Co), a Ni alloy, a Ni—Co alloy, or the like. In another alternative embodiment, the frame 21F may include at least one selected from various metal materials. In another alternative embodiment, the frame 21F may include a polymer compound, for example, a polymer.

The wire 21WR may extend in the longitudinal direction of the frame 21F. The wire 21WR may be fixed to the head 21H. In an embodiment, an end of the wire 21WR may be fixed to the head 21H. Thus, when a length of the wire 21WR decreases, the frame 21F may be bent. In such an embodiment, the wire 21WR may apply a torsion moment (or a moment of torsion) to the frame 21F, and the frame 21F may be bent due to the torsion moment.

The wire 21WR may be disposed or arranged between the display panel 10 and the body 21B. The wire 21WR may extend between the display panel 10 and the body 21B and may be fixed to the head 21H. Thus, the wire 21WR may apply a torsion moment to the frame 21F.

The wire 21WR may pass through the through hole 21PH. In an embodiment, the wire 21WR may pass through one through hole 21PH. In an alternative embodiment, the wire 21WR may pass through a plurality of through holes 21PH. In an embodiment, the protrusion pattern 21P with the through hole 21PH through which the wire 21WR passes may be apart from the head 21H. Thus, when the length of the wire 21WR decreases, the protrusion pattern 21P may control the torsion moment applied to the frame 21F, and control a shape in which the frame 21F is bent.

The intermediate frame 21MF may be disposed or arranged between the display panel 10 and the frame 21F. In an embodiment, the intermediate frame 21MF may be arranged between the plurality of supporters 27 and the frame 21F. In an embodiment, the intermediate frame 21MF may be fixed to the plurality of supporters 27. The intermediate frame 21MF may extend in the longitudinal direction of the frame 21F. In one embodiment, for example, the intermediate frame 21MF may extend in the y direction in FIG. 4. In an embodiment, the intermediate frame 21MF and the frame 21F may extend side by side. The intermediate frame 21MF and the frame 21F may face each other. The frame 21F may have the head 21H and/or the protrusion pattern 21P, and when the frame 21F is bent, a strain may be concentrated on the display panel 10 and/or the plurality of supporters 27 overlapping the head 21H and/or the protrusion pattern 21P. In an embodiment, the intermediate frame 21MF may prevent or reduce the concentration of a strain on at least a portion of the display panel 10 and/or the plurality of supporters 27 due to the frame 21F.

In an embodiment, the intermediate frame 21MF may move relative to the head 21H. In such an embodiment, the head 21H may move relative to the intermediate frame 21MF. In such an embodiment, a portion of the intermediate frame 21MF and a portion of the frame 21F may be fixed, but the intermediate frame 21MF and the head 21H may not be fixed to each other. In an embodiment, a point where the intermediate frame 21MF and the head 21H are fixed to each other may be a point where the first frame set 23 (see FIG. 3A) and the second frame set 25 (see FIG. 3A) cross each other. In one embodiment, for example, the portion of the intermediate frame 21MF and the portion of the frame 21F may be welded. In one alternative embodiment, for example, a groove may be defined or provided in a portion of the intermediate frame 21MF, a protrusion may be provided in a portion of the frame 21F, and the portion of the intermediate frame 21MF and the portion of the frame 21F may be fixed to each other. In one alternative embodiment, for example, a protrusion may be provided in a portion of the intermediate frame 21MF, a groove may be provided in a portion of the frame 21F, and the portion of the intermediate frame 21MF and the portion of the frame 21F may be fixed to each other.

In a case where the intermediate frame 21MF and the head 21H are fixed to each other, when the frame 21F is bent, the display panel 10 may be bent a preset value or more. In this case, the display panel 10 may stretch beyond a preset value, and thus, the display panel 10 may be damaged. In an embodiment of the invention, the intermediate frame 21MF may move relative to the head 21H, and thus, the display panel 10 may be bent a preset value or less. Thus, the damage to the display panel 10 may be prevented or reduced.

The intermediate frame 21MF may include austenitic stainless steels. In an alternative embodiment, the intermediate frame 21MF may include stainless steel, invar, nickel (Ni), cobalt (Co), a Ni alloy, a Ni—Co alloy, or the like. In another alternative embodiment, the intermediate frame 21MF may include at least one selected from various metal materials. In another alternative embodiment, the intermediate frame 21MF may include a polymer compound, for example, a polymer.

One of the head 21H and the intermediate frame 21MF may have a concave portion 21CA that faces the other one of the head 21H and the intermediate frame 21MF. In addition, the other one of the head 21H and the intermediate frame 21MF may have a convex portion 21CB that faces the concave portion 21CA. In one embodiment, for example, the head 21H may have the concave portion 21CA, and the intermediate frame 21MF may have the convex portion 21CB. In an alternative embodiment, the head 21H may have the convex portion 21CB, and the intermediate frame 21MF may have the concave portion 21CA. Hereinafter, for convenience of description, embodiments where the head 21H has the concave portion 21CA, and the intermediate frame 21MF has the convex portion 21CB will be mainly described in detail.

Each of the concave portion 21CA and the convex portion 21CB may extend in the longitudinal direction of the frame 21F. The concave portion 21CA and the convex portion 21CB may face each other. The concave portion 21CA and the convex portion 21CB may guide the head 21H and the intermediate frame 21MF to move relatively in one direction. Thus, the concave portion 21CA and the convex portion 21CB may increase the reliability of the frame set 21.

Figure 5A:
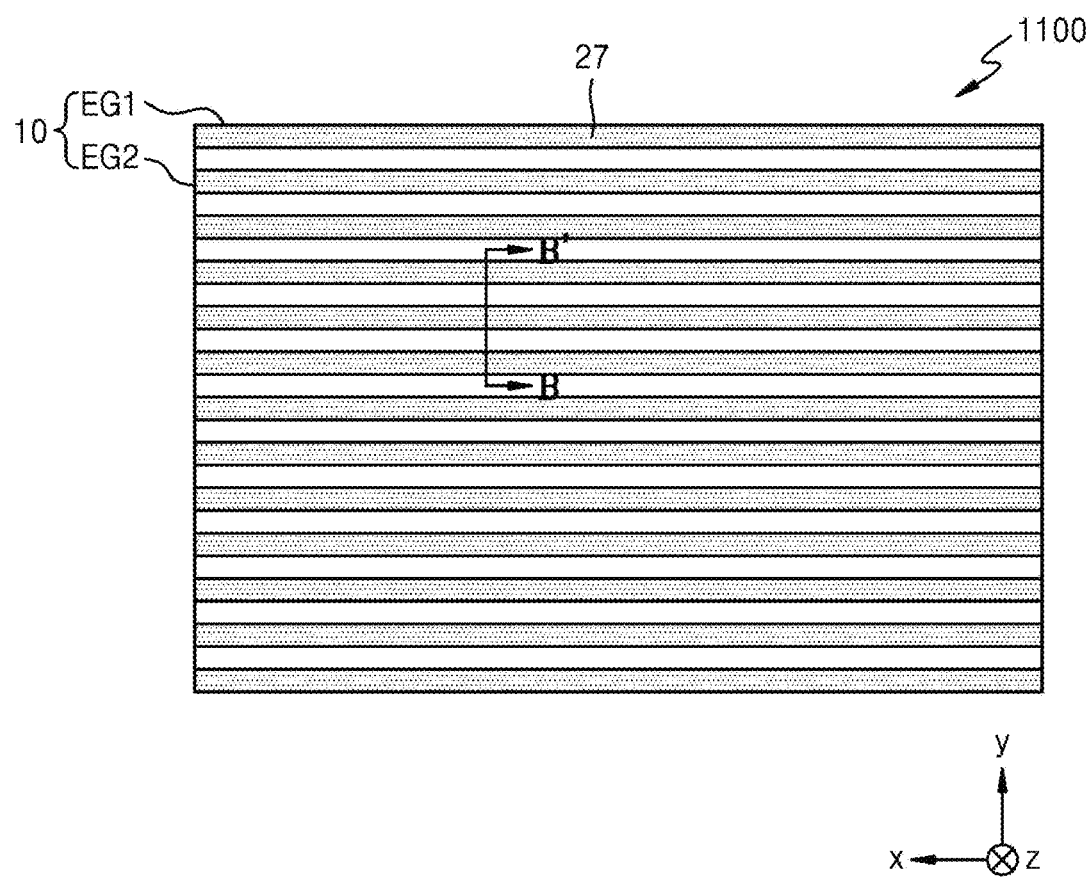
FIGS. 5A, 5B, and 5C are plan views schematically illustrating a plurality of supporters and a display panel according to various embodiments.
Figure 5B:
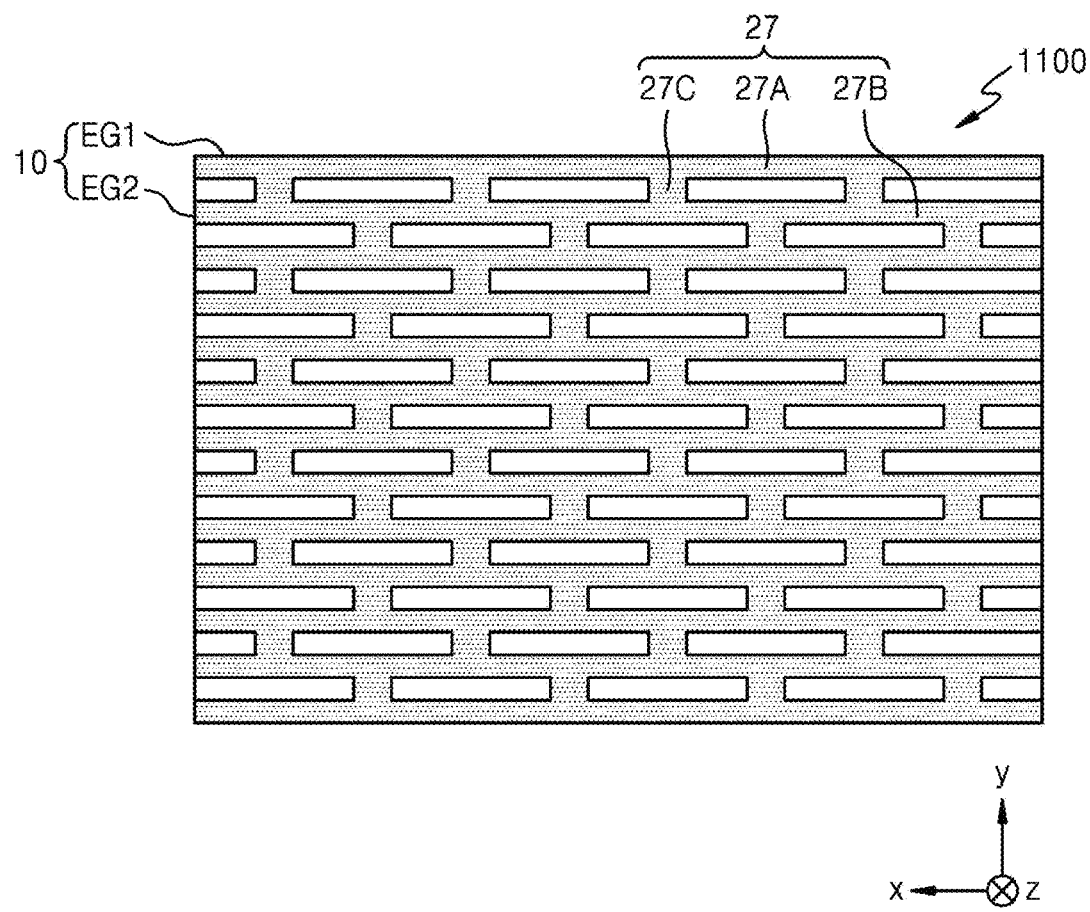
Figure 5C:
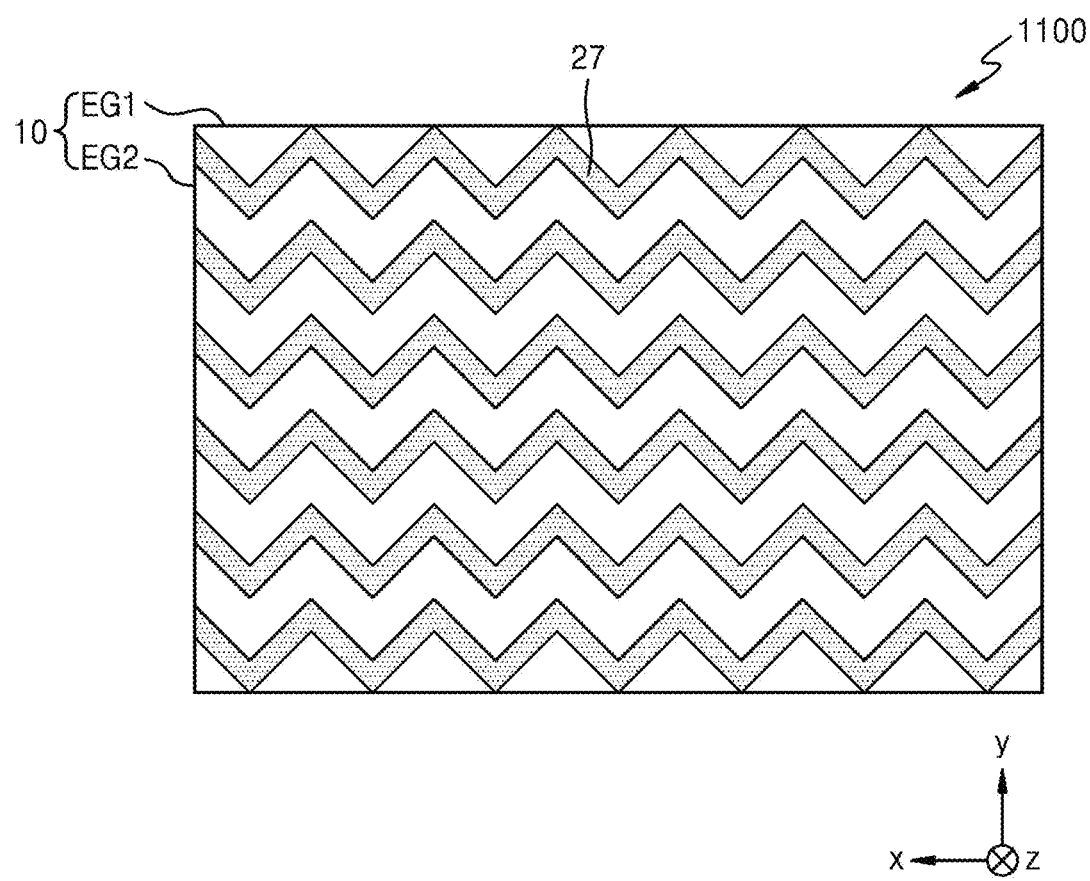

FIGS. 5A, 5B, and 5C are plan views schematically illustrating the plurality of supporters 27 and the display panel 10 according to various embodiments. In FIGS. 5A to 5C, the same or like reference numerals as those of FIG. 3A denote the same or like elements, and any repetitive detailed descriptions thereof will be omitted.

Referring to FIGS. 5A to 5C, an embodiment of the display panel 10 may include the first edge EG1 extending in the first direction (for example, the x direction or the −x direction), and the second edge EG2 extending in the second direction (for example, the y direction or the −y direction). The plurality of supporters 27 may support the display panel 10. The plurality of supporters 27 may maintain a shape of the display panel 10. In an embodiment, the plurality of supporters 27 may be arranged side by side in the second direction (for example, the y direction or the −y direction).

Referring to FIG. 5A, in an embodiment, the plurality of supporters 27 may extend in the first direction (for example, the x direction or the −x direction). The plurality of supporters 27 may be apart from one another in the second direction (for example, the y direction or the −y direction).

Referring to FIG. 5B, in an alternative embodiment, the plurality of supporters 27 may include a first supporter 27A and a second supporter 27B adjacent to each other. In such an embodiment, the first supporter 27A and the second supporter 27B may be connected to each other. The first supporter 27A and the second supporter 27B may be connected to each other by a connection portion 27C. In such an embodiment, the connection portion 27C may be provided in plural. In such an embodiment, each of the plurality of connection portions 27C may connect the first supporter 27A and the second supporter 27B to each other.

In an embodiment, the connection portion 27C may be integrally formed as a single body with the first supporter 27A and the second supporter 27B. In an alternative embodiment, the connection portion 27C may include a material having a different modulus from those of the first supporter 27A and/or the second supporter 27B.

In an embodiment, the first supporter 27A and the second supporter 27B may be connected to each other. In such an embodiment, the increase in gap between the first supporter 27A and the second supporter 27B when the plurality of supporters 27 are bent may be prevented or reduced.

Referring to FIG. 5C, in another alternative embodiment, an extension direction of each of the plurality of supporters 27 may be changed at least twice. In one embodiment, for example, a first portion of a supporter 27 may extend in a first extension direction. A second portion of the supporter 27 adjacent to the first portion of the supporter 27 may extend in a second extension direction crossing the first extension direction. A third portion of the supporter 27 adjacent to the second portion of the supporter 27 may extend in a third extension direction crossing the second extension direction. In such an embodiment, as described above, an extension direction of the supporter 27 may be changed at least twice.

In an embodiment, the supporter 27 may have a linear shape, and an extension direction of the supporter 27 may be changed at least twice. In another alternative embodiment, the supporter 27 may have a curved shape, and an extension direction of the supporter 27 may be changed at least twice. Thus, the plurality of supporters 27 may support the display panel 10 and bend the display panel 10 in a preset shape. In an embodiment, the plurality of supporters 27 may be arranged in various shapes on the rear side of the display panel 10 according to a preset bending limit of the display panel 10.

Figure 6:
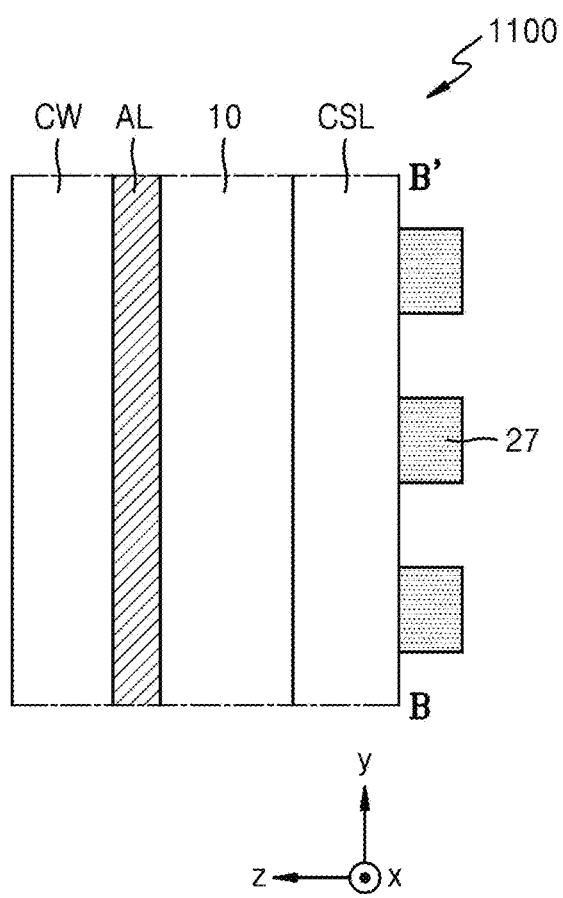
FIG. 6 is a cross-sectional view schematically illustrating a display unit in FIG. 2, taken along line B-B' in FIG. 2.

FIG. 6 is a cross-sectional view schematically illustrating the display unit 1100 in FIG. 2, taken along line B-B' in FIG. 2. In FIG. 6, the same or like reference numerals as those of FIGS. 2 and 3A denote the same or like elements, and any repetitive detailed descriptions thereof will be omitted.

Referring to FIG. 6, an embodiment of the display unit 1100 may include the display panel 10, a cover window CW, an adhesive layer AL, a cushion layer CSL, and the plurality of supporters 27.

The cover window CW may be disposed or arranged on the display panel 10. The cover window CW may include a flexible window. The cover window CW may be easily bent in response to an external force without the occurrence of cracks or the like, thereby protecting the display panel 10. In an embodiment, the cover window CW may include a stretchable cover window that may be stretched and/or contracted.

The cover window CW may include an organic material. In one embodiment, for example, the cover window CW may include a urethane-based material. The cover window CW may include polyurethane. The cover window CW may include a polymer compound, for example, a polymer.

The adhesive layer AL may be arranged between the display panel 10 and the cover window CW. The adhesive layer AL may attach the display panel 10 and the cover window CW to each other. In an embodiment, the adhesive layer AL may include an optically clear adhesive ("OCA").

The cushion layer CSL may be disposed or arranged between the display panel 10 and the plurality of supporters 27. The cushion layer CSL may act as a buffer between the display panel 10 and the plurality of supporters 27. In one embodiment, for example, each of the plurality of supporters 27 may move in the third direction (for example, the z direction or the −z direction). The movement distances of the plurality of supporters 27 in the third direction (for example, the z direction or the −z direction) may be different from each other. In such an embodiment, a position of the cushion layer CSL may be continuously changed in response to discontinuous movement distances of the plurality of supporters 27. Thus, a position of the display panel 10 may be continuously changed by the cushion layer CSL and the plurality of supporters 27, and may be bent. In such an embodiment, the cushion layer CSL may prevent or reduce the damage to the display panel 10 due to the plurality of supporters 27.

In an embodiment, the cushion layer CSL may include an elastomer. In one embodiment, for example, the cushion layer CSL may include at least one selected from vulcanized natural rubber, synthetic rubber, elastic fiber, foam, and thermoplastic elastomer. In one alternative embodiment, for example, the cushion layer CSL may include at least one selected from polyolefine, polyvinyl chloride, elastomeric silicone, elastomeric polyurethane, and elastomeric polyisoprene. In an embodiment, a first lower adhesive layer may be arranged between the cushion layer CSL and the display panel 10. In an embodiment, a second lower adhesive layer may be arranged between the cushion layer CSL and the plurality of supporters 27. In one embodiment, for example, at least one selected from the first lower adhesive layer and the second lower adhesive layer may include a pressure sensitive adhesive ("PSA").

Figure 7:
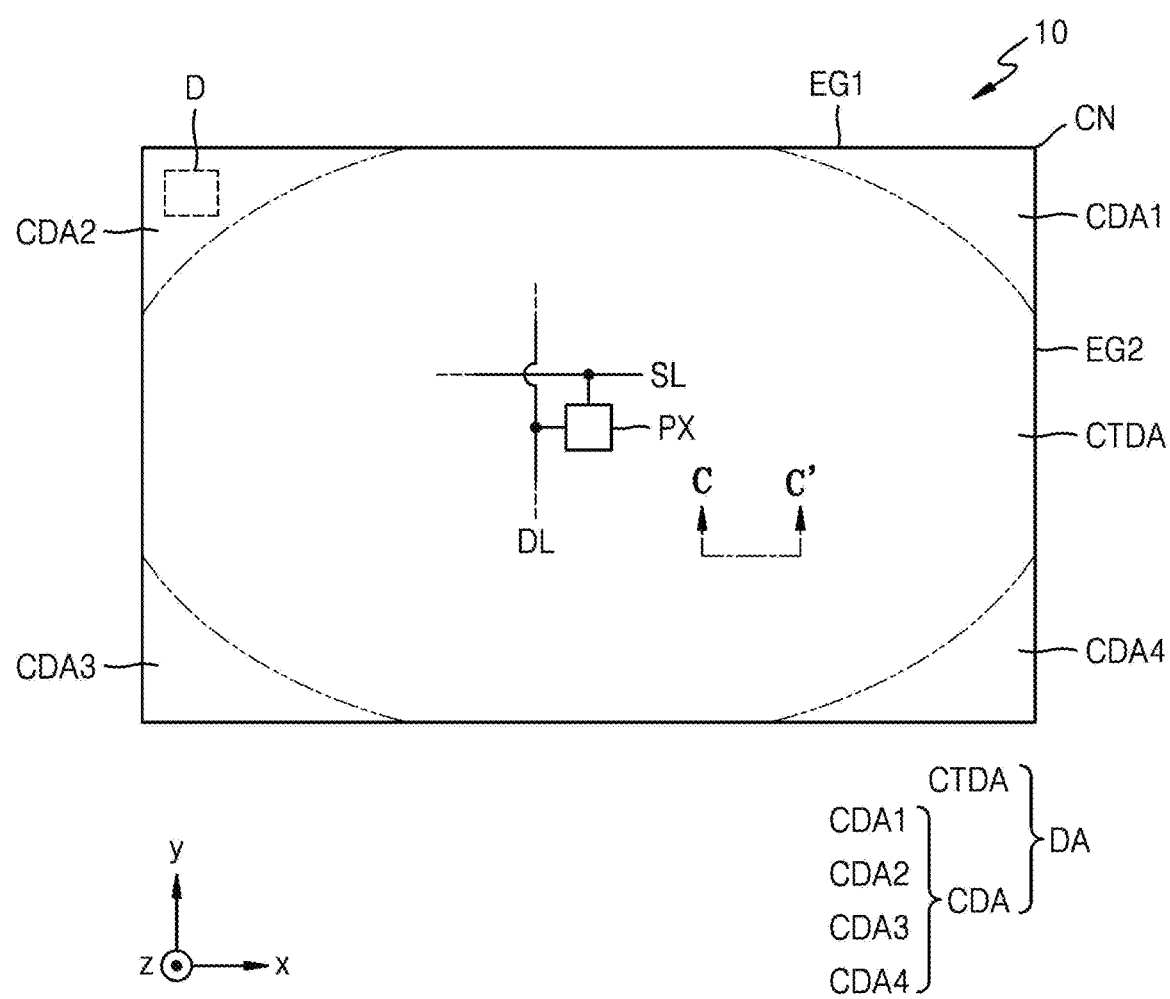
FIG. 7 is a plan view of a display panel according to an embodiment.

FIG. 7 is a plan view of the display panel 10 according to an embodiment. In FIG. 7, the same or like reference numerals as those of FIG. 2 denote the same or like elements, and any repetitive detailed descriptions thereof will be omitted.

Referring to FIG. 7, an embodiment of the display panel 10 may include edges. In an embodiment, the display panel 10 may include the first edge EG1 extending in the first direction (for example, the x direction or the −x direction), and the second edge EG2 extending in the second direction (for example, the y direction or the −y direction). The first edge EG1 and the second edge EG2 may include ends of the display panel 10. In an embodiment, the first edge EG1 and the second edge EG2 may meet each other.

The display panel 10 may include an organic light-emitting display panel that uses an organic light-emitting diode including an organic emission layer as a display element. In an embodiment, the display panel 10 may include a light-emitting diode display panel that uses a light-emitting diode as a display element. A size of the light-emitting diode may be on a microscale or a nanoscale. In one embodiment, for example, the light-emitting diode may include a micro light-emitting diode. In an embodiments, the light-emitting diode may include a nanorod light-emitting diode. The nanorod light-emitting diode may include gallium nitride (GaN). In an embodiment, a color-conversion layer may be disposed or arranged on the nanorod light-emitting diode. The color-conversion layer may include quantum dots. In an embodiment, the display panel 10 may include a quantum dot light-emitting display panel that uses a quantum dot light-emitting diode including a quantum dot emission layer as a display element. In an embodiment, the display panel 10 may include an inorganic light-emitting display panel that uses an inorganic light-emitting element including an inorganic semiconductor as a display element. Hereinafter, for convenience of description, embodiments where the display panel 10 includes an organic light-emitting display panel using an organic light-emitting diode as a display element will be mainly described in detail.

In an embodiment, the display panel 10 may include the display area DA. The display area DA may display images. A pixel PX may be arranged in the display area DA. In an embodiment, the pixel PX may be connected to a scan line SL extending in the first direction (for example, the x direction or the −x direction). In an embodiment, the pixel PX may be connected to a data line DL extending in the second direction (for example, the y direction or the −y direction).

The display panel 10 may include a plurality of pixels PX, and the display panel 10 may display an image using the plurality of pixels PX. Each of the pixels PX may include sub-pixels, each of which emits light of a color using a display element. Herein, a sub-pixel refers to an emission area, which is a smallest unit for realizing an image.

In an embodiment, the display area DA may include a central display area CTDA and a corner display area CDA. The central display area CTDA may be disposed or arranged in the center of the display panel 10. The corner display area CDA may be disposed or arranged between the central display area CTDA and a corner CN where the edges of the display panel 10 meet. The corner CN may be defined as a portion where edges extending in different directions cross each other. In an embodiment, when the display panel 10 has a polygonal shape, the display panel 10 may include a plurality of corners CN.

In an embodiment, the display panel 10 may include the plurality of corner display areas CDA. In one embodiment, for example, the display panel 10 may include a first corner display area CDA1, a second corner display area CDA2, a third corner display area CDA3, and a fourth corner display area CDA4. In an embodiment, the first corner display area CDA1 may be disposed or arranged between the central display area CTDA, the first edge EG1, and the second edge EG2.

The display panel 10 may include a structure and/or a material that may be stretched and/or contracted. Thus, the display panel 10 may be bent from the first direction (for example, the x direction or the −x direction) to the third direction (for example, the z direction or the −z direction), and may be bent from the second direction (for example, the y direction or the −y direction) to the third direction (for example, the z direction or the −z direction).

In an embodiment, in the corner display area CDA, the display panel 10 may include a structure and/or a material that may be stretched and/or contracted. Thus, the corner display area CDA may be bent from the first direction (for example, the x direction or the −x direction) to the third direction (for example, the z direction or the −z direction), and may be bent from the second direction (for example, the y direction or the −y direction) to the third direction (for example, the z direction or the −z direction).

In an embodiment, the corner display area CDA may be deformed more than the central display area CTDA, and a magnitude of stress applied to the corner display area CDA may be relatively larger than a magnitude of stress applied to the central display area CTDA. In an embodiment where the corner display area CDA has a structure and/or a material that may be stretched or contracted, a magnitude of stress applied to the corner display area CDA may decrease, thereby preventing or reducing the damage to the display panel 10 in the corner display area CDA. The central display area CTDA may also have a structure and/or a material that may be stretched or contracted.

Figure 8:
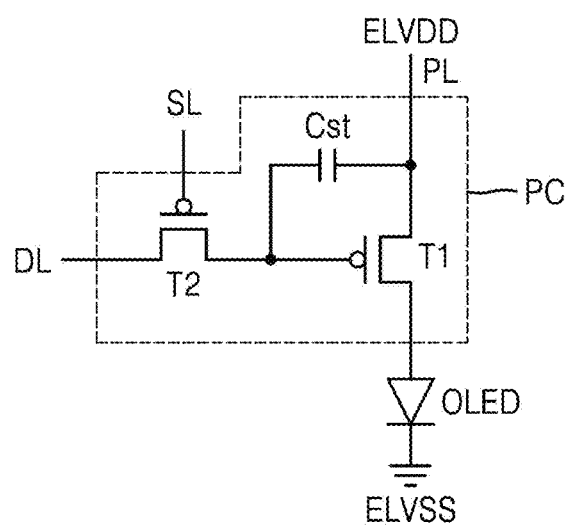
FIG. 8 is an equivalent circuit diagram schematically illustrating a pixel circuit of a display panel, according to an embodiment.

FIG. 8 is an equivalent circuit diagram schematically illustrating a pixel circuit PC that may be applied to a display panel, according to an embodiment.

Referring to FIG. 8, an embodiment of the pixel circuit PC may be connected to a display element, for example, an organic light-emitting diode OLED.

The pixel circuit PC may include a driving thin-film transistor T1, a switching thin-film transistor T2, and a storage capacitor Cst. In such an embodiment, the organic light-emitting diode OLED may emit one of red, green, and blue light, or may emit one of red, green, blue, and white light.

The switching thin-film transistor T2 may be connected to a scan line SL and a data line DL, and may transfer, to the driving thin-film transistor T1, a data signal or a data voltage received via the data line DL based on a scan signal or a switching voltage received via the scan line SL. The storage capacitor Cst may be connected to the storage capacitor Cst and a driving voltage line PL, and may store a voltage corresponding to a voltage difference between a voltage received from the switching thin-film transistor T2 and a first power voltage ELVDD applied to the driving voltage line PL.

The driving thin-film transistor T1 may be connected to the driving voltage line PL and the storage capacitor Cst, and may control a driving current flowing from the driving voltage line PL to the organic light-emitting diode OLED in response to the voltage stored in the storage capacitor Cst. The organic light-emitting diode OLED may emit light having a luminance by the driving current. An opposite electrode of the organic light-emitting diode OLED may receive a second power voltage ELVSS.

In an embodiment, as shown in FIG. 8, the pixel circuit PC includes two thin-film transistors and a single storage capacitor, but not being limited thereto. Alternatively, the pixel circuit PC may include two or more storage capacitors and/or two or more thin-film transistors.

Figure 9:
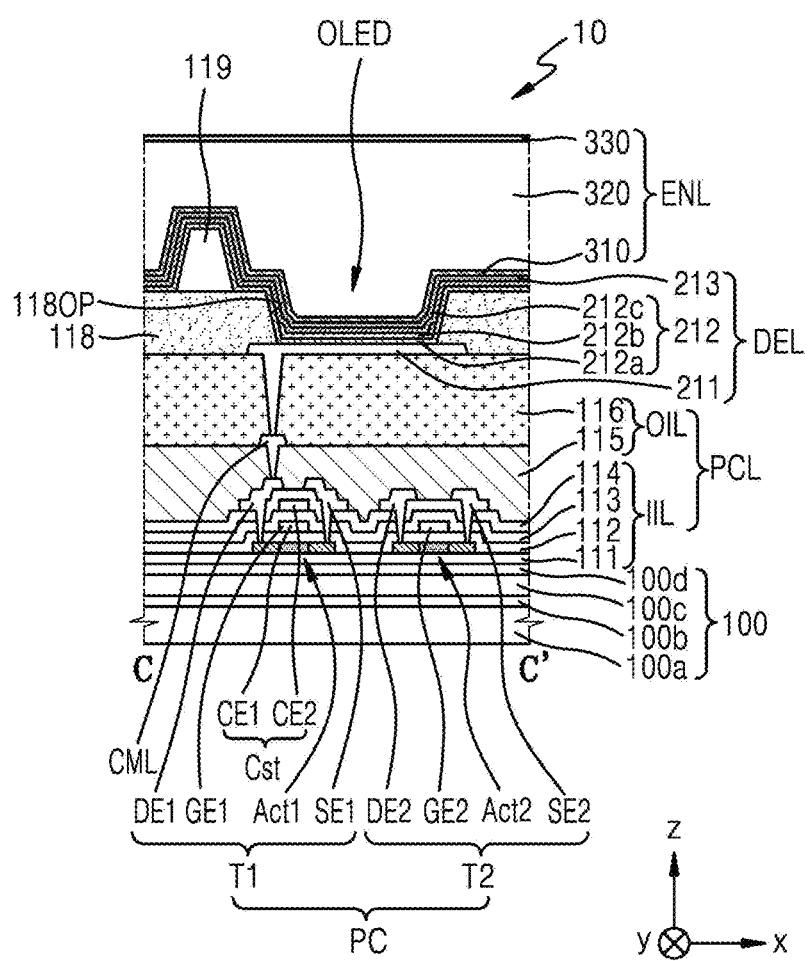
FIG. 9 is a cross-sectional view of the display panel in FIG. 7 taken along line C-C' in FIG. 7, according to an embodiment.

FIG. 9 is a cross-sectional view of the display panel 10 in FIG. 7 taken along line C-C' in FIG. 7, according to an embodiment.

Referring to FIG. 9, an embodiment of the display panel 10 may include a substrate 100, a pixel circuit layer PCL, a display element layer DEL, and an encapsulation layer ENL.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked one on another and collectively define the substrate 100. In an alternative embodiment, the substrate 100 may include glass.

At least one selected from the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like.

The first barrier layer 100b and the second barrier layer 100d may include barrier layers for preventing the penetration of external impurities, and may include a single layer or multiple layers including silicon nitride ($SiN_x$), silicon oxide ($SiO_2$), and/or silicon oxynitride (SiON).

The pixel circuit layer PCL may be disposed or arranged on the substrate 100. The pixel circuit layer PCL may include a pixel circuit PC. The pixel circuit PC may include a driving thin-film transistor T1, a switching thin-film transistor T2, and a storage capacitor Cst.

The pixel circuit layer PCL may include an inorganic insulating layer IIL and an organic insulating layer OIL disposed or below and/or above elements of the driving thin-film transistor T1. The inorganic insulating layer IIL may include a buffer layer 111, a first gate insulating layer 112, a second gate insulating layer 113, and an interlayer insulating layer 114. The organic insulating layer OIL may include a first organic insulating layer 115 and a second organic insulating layer 116. The driving thin-film transistor T1 may include a first semiconductor layer Act1, a first gate electrode GE1, a first source electrode SE1, and a first drain electrode DE1.

The buffer layer 111 may be disposed or arranged on the substrate 100. The buffer layer 111 may include an inorganic insulating material such as $SiN_x$, SiON, and $SiO_2$, and may have a single layer structure or a multilayer structure, each layer including at least one selected from the inorganic insulating materials described above.

The first semiconductor layer Act1 may be disposed or arranged on the buffer layer 111. The first semiconductor layer Act1 may include polysilicon. In an embodiment, the first semiconductor layer Act1 may include amorphous silicon, an oxide semiconductor, or an organic semiconductor. The first semiconductor layer Act1 may include a channel area, a drain area, and a source area, the drain area and the source area being arranged at opposite sides of the channel area.

The first gate electrode GE1 may overlap the channel area. The first gate electrode GE1 may include a low-resistance metal material. The first gate electrode GE1 may include a conductive material including molybdenum (Mo), aluminum (Al), copper (Cu), titanium (Ti), or the like, and may have a single layer structure or a multilayer structure, each layer including at least one selected from the materials described above.

The first gate insulating layer 112 between the first semiconductor layer Act1 and the first gate electrode GE1 may include an inorganic insulating material such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1. Similar to the first gate insulating layer 112, the second gate insulating layer 113 may include an inorganic insulating material such as $SiO_2$, $SiN_x$, SiON, $Al_2O_3$, $TiO_2$, $Ta_2O_5$, $HfO_2$, and/or ZnO.

An upper electrode CE2 of the storage capacitor Cst may be disposed or arranged on the second gate insulating layer 113. The upper electrode CE2 may overlap the first gate electrode GE1 therebelow. In an embodiment, the first gate electrode GE1 of the driving thin-film transistor T1 and the upper electrode CE2 overlapping each other with the second gate insulating layer 113 therebetween may be included in the storage capacitor Cst. In such an embodiment, the first gate electrode GE1 of the driving thin-film transistor T1 may function as a lower electrode CE1 of the storage capacitor Cst.

In an embodiment, as described above, the storage capacitor Cst and the driving thin-film transistor T1 may overlap each other. In an alternative embodiment, the storage capacitor Cst may not overlap the driving thin-film transistor T1.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), Mo, Ti, tungsten (W), and/or Cu, and may have a single layer structure or a multilayer structure, each layer including at least one selected from the materials described above.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, ZnO, or the like. The interlayer insulating layer 114 may have a single layer structure or a multilayer structure, each layer including at least one selected from the inorganic insulating materials described above.

Each of the first drain electrode DE1 and the first source electrode SE1 may be disposed or arranged on the interlayer insulating layer 114. Each of the first drain electrode DE1 and the first source electrode SE1 may include a material having good conductivity. The first drain electrode DE1 and the first source electrode SE1 may each include a conductive material including Mo, Al, Cu, Ti, or the like, and may have a single layer structure or a multilayer structure, each layer including at least one selected from the above material. In an embodiment, each of the first drain electrode DE1 and the first source electrode SE1 may have a multi-layer structure of a Ti layer, an Al layer, and another Ti layer.

The switching thin-film transistor T2 may include a second semiconductor layer Act2, a second gate electrode GE2, a second drain electrode DE2, and a second source electrode SE2. Because the second semiconductor layer Act2, the second gate electrode GE2, the second drain electrode DE2, and the second source electrode SE2 are similar to the first semiconductor layer Act1, the first gate electrode GE1, the first drain electrode DE1, and the first source electrode SE1, respectively, any repetitive detailed descriptions thereof will be omitted.

The first organic insulating layer 115 may cover the first drain electrode DE1 and the first source electrode SE1. The first organic insulating layer 115 may include an organic material. In one embodiment, for example, the first organic insulating layer 115 may include an organic insulating material, such as a general-purpose polymer such as poly (methyl methacrylate) ("PMMA") and polystyrene ("PS"), polymer derivatives having a phenol-based group, an acryl-based polymer, an imide-based polymer, aryl ether-based polymer, an amide-based polymer, a fluorine-based polymer, a p-xylene-based polymer, a vinyl alcohol-based polymer, or a combination thereof.

A connection electrode CML may be disposed or arranged on the first organic insulating layer 115. In an embodiment, the connection electrode CML may be electrically connected to the first drain electrode DE1 or the first source electrode SE1 through a contact hole defined in the first organic insulating layer 115. The connection electrode CML may include a material having high conductivity. The connection electrode CML may include a conductive material including Mo, Al, Cu, Ti, or the like, and may have a single layer structure or a multilayer structure, each layer including at least one selected from the materials described above. In an embodiment, the connection electrode CML may have a multi-layer structure of a Ti layer, an Al layer, and another Ti layer.

The second organic insulating layer 116 may cover the connection electrode CML. The second organic insulating layer 116 may include an organic material. The second organic insulating layer 116 may include an organic material, such as a general-purpose polymer such as PMMA or PS, a polymer derivative having a phenol-based group, or an acryl-based polymer, an imide-based polymer, an aryl-ether-based polymer, an amide-based polymer, a fluorine-based polymer, a p-xylene-based polymer, a vinyl alcohol-based polymer, or a combination thereof. In an alternative embodiment, the connection electrode CML and the second organic insulating layer 116 may be omitted.

The display element layer DEL may be disposed or arranged on the pixel circuit layer PCL. The display element layer DEL may include a display element. An organic light-emitting diode OLED as a display element may include a pixel electrode 211, an intermediate layer 212, and an opposite electrode 213.

The pixel electrode 211 of the organic light-emitting diode OLED may be electrically connected to the connection electrode CML through a contact hole defined in the second organic insulating layer 116. Thus, the organic light-emitting diode OLED may be electrically connected to the pixel circuit PC.

In an embodiment, the pixel electrode 211 may include a conductive oxide such as indium tin oxide ("ITO"), indium zinc oxide ("IZO"), ZnO, $In_2O_3$, indium gallium oxide ("IGO"), or aluminum zinc oxide ("AZO"). In an alternative embodiment, the pixel electrode 211 may include a reflective layer including Ag, Mg, Al, Pt, Pd, Au, Ni, Nd, Ir, Cr, or any compounds thereof. In another alternative embodiment, the pixel electrode 211 may further include a layer including ITO, IZO, ZnO, or $In_2O_3$, on or below the reflective layer described above.

A pixel-defining layer 118, in which an opening 1180P is defined to expose a central portion of the pixel electrode 211, may be disposed or arranged on the pixel electrode 211. The pixel-defining layer 118 may include an organic insulating material and/or an inorganic insulating material. The opening 1180P may define an emission area of light emitted by the organic light-emitting diode OLED. In one embodiment, for example, a width of the opening 1180P may correspond to a width of the emission area.

A spacer 119 may be disposed or arranged on the pixel-defining layer 118. In an embodiment, a mask sheet may be used in a method of manufacturing the display panel 10, and in such an embodiment, the mask sheet may enter the opening 1180P of the pixel-defining layer 118 or may be in close contact with the pixel-defining layer 118. In such an embodiment, the spacer 119 may prevent a defect in which the substrate 100 and a portion of a multi-layer on the substrate 100 are damaged or broken due to the mask sheet when a deposition material is deposited on the substrate 100.

In an embodiment, the spacer 119 may include an organic material such as polyimide. In an embodiment, the spacer 119 may include an inorganic insulating material such as $SiN_X$ or $SiO_2$, or may include an organic insulating material and an inorganic insulating material.

In an embodiment, the spacer 119 may include a material different from a material of the pixel-defining layer 118. In an alternative embodiment, the spacer 119 may include a same material as the pixel-defining layer 118, and in such an embodiment, the pixel-defining layer 118 and the spacer 119 may be formed together in a mask process using a halftone mask or the like.

The intermediate layer 212 may be disposed or arranged on the pixel-defining layer 118 and the pixel electrode 211. The intermediate layer 212 may include an emission layer 212b in the opening 1180P of the pixel-defining layer 118. The emission layer 212b may include a polymer organic material or a low-molecular weight organic material emitting light of a color.

A first functional layer 212a and a second functional layer 212c may be arranged below and above the emission layer 212b, respectively. In one embodiment, for example, the first functional layer 212a may include a hole transport layer ("HTL"), or may include an HTL and a hole injection layer ("HIL"). The second functional layer 212c may include an element arranged above the emission layer 212b and may be optional. The second functional layer 212c may include an electron transport layer ("ETL") and/or an electron injection layer ("EIL"). Like the opposite electrode 213 to be described later, the first functional layer 212a and/or the second functional layer 212c may include common layers that entirely cover the substrate 100.

The opposite electrode 213 may include a conductive material having a low work function. In one embodiment, for example, the opposite electrode 213 may include a (semi-)transparent layer including Ag, Mg, Al, Pt, Pd, Au, Ni, Nd, Ir, Cr, Li, Ca, or any alloys thereof. In an embodiment, the opposite electrode 213 may further include a layer including ITO, IZO, ZnO, or $In_2O_3$, on the (semi)transparent layer including the materials described above.

A capping layer (not shown) may be further disposed or arranged on the opposite electrode 213. The capping layer may include lithium fluoride (LiF), an inorganic material, and/or an organic material.

The encapsulation layer ENL may be disposed or arranged on the opposite electrode 213. In an embodiment, the encapsulation layer ENL may include at least one inorganic encapsulation layer and at least one organic encapsulation layer. In an embodiment, as shown in FIG. 9, the encapsulation layer ENL includes a first inorganic encapsulation layer 310, an organic encapsulation layer 320, and a second inorganic encapsulation layer 330 that are sequentially stacked one on another.

At least one of the first inorganic encapsulation layer 310 and the second inorganic encapsulation layer 330 may include at least one inorganic materials selected from $Al_2O_3$, $TiO_2$, $Ta_2O_5$, $HfO_2$, ZnO, $SiO_2$, $SiN_X$, and SiON. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

Although not shown, a touch electrode layer may be disposed or arranged on the encapsulation layer ENL, and an optical functional layer may be arranged on the touch electrode layer. The touch electrode layer may obtain coordinate information according to an external input, for example, a touch event. The optical functional layer may reduce reflectivity of (external) light incident toward the display device from the outside, and/or may improve the color purity of light emitted from the display device. In an embodiment, the optical functional layer may include a retarder and/or a polarizer. A retarder may be of a film type or a liquid crystal coating type and may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. At least one selected from the retarder and the polarizer may further include a protective film.

In an alternative embodiment, the optical functional layer may include a black matrix and color filters. The color filters may be arranged in consideration of a color of light emitted by each of pixels of the display device. Each of the color filters may include red, green, or blue pigment or dye. In an embodiment, each of the color filters may further include quantum dots in addition to the above-described pigment or dye. In an embodiment, some of the color filters may not include the pigment or dye described above, and may include scattering particles such as $TiO_2$.

In an alternative embodiment, the optical functional layer may include a destructive interference structure. The destructive interference structure may include a first reflection layer and a second reflection layer disposed in different layers from each other. First reflected light and second reflected light respectively reflected from the first reflective layer and the second reflective layer may destructively interfere with each other, and thus, the reflectivity of external light may decrease.

An adhesive member may be disposed or arranged between the touch electrode layer and the optical functional layer. In an embodiment, a normal adhesive known in the art may be employed as the adhesive member without limitation. In one embodiment, for example, the adhesive member may include a PSA.

Figure 10:
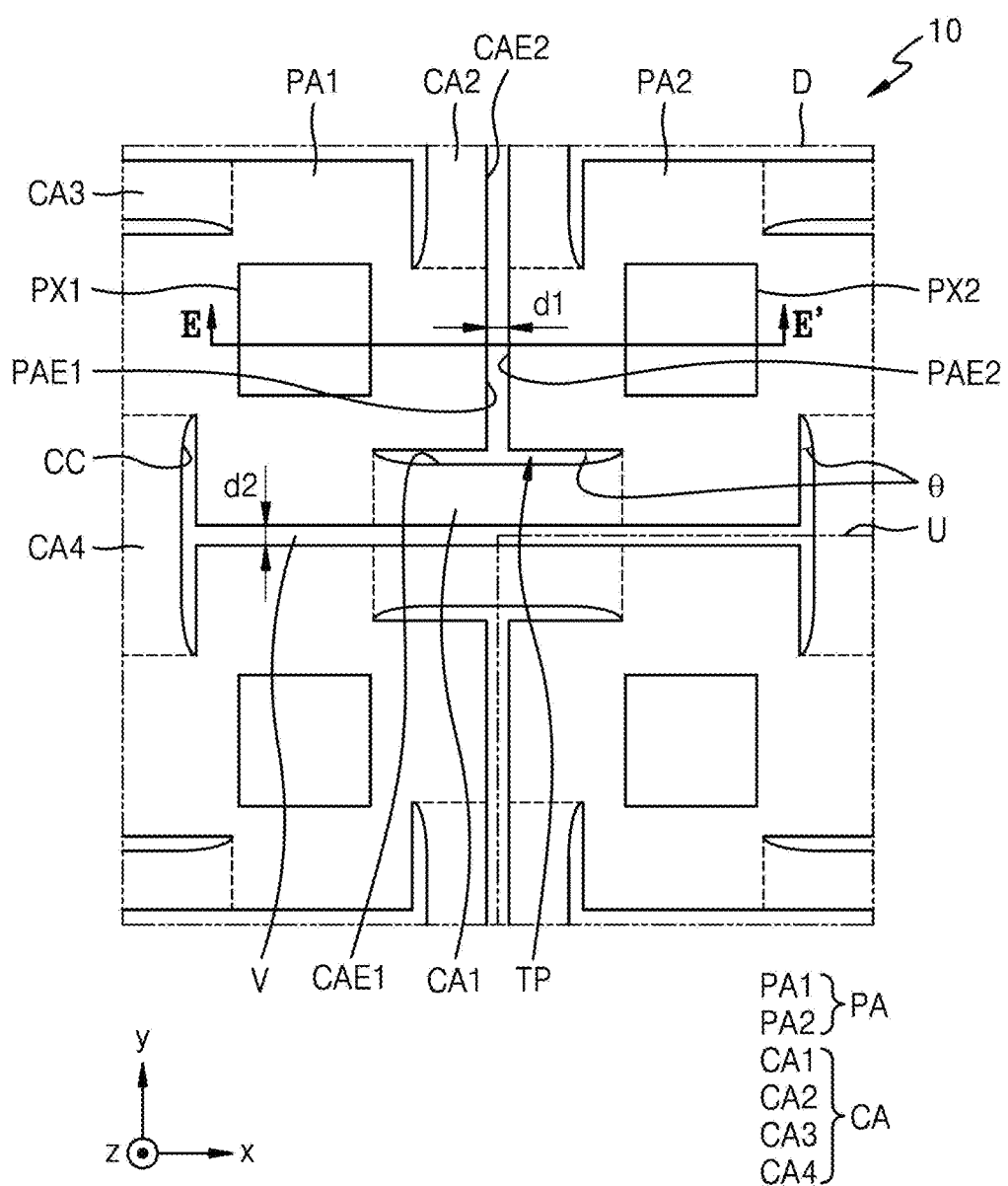
FIG. 10 is an enlarged view of region D of the display panel in FIG. 7, according to an embodiment.

FIG. 10 is an enlarged view of region D of the display panel 10 in FIG. 7 according to an embodiment.

Referring to FIG. 10, the display panel 10 may include a through portion TP that is defined through the display panel 10. An element of the display panel 10 may not be arranged in the through portion TP. Thus, the display panel 10 may be stretched and/or contracted without being damaged. In an alternative embodiment, the display panel 10 may not include the through portion TP. In such an embodiment, the display panel 10 may include a material that may be stretched and/or contracted. Hereinafter, for convenience of description, embodiments where the display panel 10 includes the through portion TP will be mainly described in detail.

The display panel 10 may include a pixel area PA and a connection area CA. The pixel area PA may include an area in which a pixel is arranged. The pixel area PA may include a first pixel area PA1 and a second pixel area PA2. A first pixel PX1 may be arranged in the first pixel area PA1. A second pixel PX2 may be arranged in the second pixel area PA2. The connection area CA may include a first connection area CA1, a second connection area CA2, a third connection area CA3, and a fourth connection area CA4.

The plurality of pixel areas PA may be apart from one another in the first direction (for example, the x direction or the -x direction) and/or the second direction (for example, the y direction or the -y direction). In an embodiment, the plurality of pixel areas PA may be apart from each other by a first distance d1 and a second distance d2, respectively. In one embodiment, for example, the first pixel area PA1 and the second pixel area PA2 may be apart from each other in the first direction (for example, the x direction or the -x direction) and/or the second direction (for example, the y direction or the -y direction).

The connection area CA may extend between the pixel areas PA adjacent to each other. In an embodiment, each of the pixel areas PA may be connected to four connection areas CA. In such an embodiment, the four connection areas CA connected to one pixel area PA may each extend in different directions from each other, and each of the connection areas CA may be connected to another pixel area PA arranged adjacent to the one pixel area PA described above.

In an embodiment, the first connection area CA1 may extend from the first pixel area PA1 to the second pixel area PA2. Thus, the first pixel area PA1 and the second pixel area PA2 may be connected to each other by the first connection area CA1, and the first pixel area PA1, the second pixel area PA2, and the first connection area CA1 may be integrally provided as a single body.

In an embodiment, at least a portion of the through portion TP may be defined by an edge PAE1 of the first pixel area PA1, an edge PAE2 of the second pixel area PA2, and an edge CAE1 of the first connection area CA1. In an embodiment, the at least a portion of the through portion TP may be defined by the edge PAE1 of the first pixel area PA1, the edge PAE2 of the second pixel area PA2, the edge CAE1 of the first connection area CA1, and an edge CAE2 of the second connection area CA2.

One pixel area PA and a portion of connection areas CA extending therefrom may defined a basic unit U. The basic unit U may be repeatedly arranged in the first direction (for example, the x direction or the -x direction) and the second direction (for example, the y direction or the -y direction), and the display panel 10 may be understood that the basic units U repeatedly arranged are connected to each other. Two basic units U adjacent to each other may be symmetrical to each other. In one embodiment, for example, as shown in FIG. 10, two basic units U adjacent to each other in a left and right direction may be symmetrical to each other in the left to right direction with respect to a symmetry axis located therebetween and parallel with the second direction (for example, the y direction or the -y direction). In such an embodiment, as shown in FIG. 10, two basic units U adjacent to each other in an up and down direction may have an up-down symmetry with respect to a symmetry axis located therebetween and parallel with the first direction (for example, the x direction or the -x direction).

Basic units U adjacent to each other among the plurality of basic units U, for example, the four basic units U shown in FIG. 10, may form a closed curve CL therebetween, and the closed curve CC may define a space area V, which is an empty space. The space area V may be defined by the closed curve CC formed by the edges of the plurality of pixel areas PA and the edges of the plurality of connection areas CA. Each space area V may be defined through the display panel 10 and extend from an upper surface to a lower surface of the display panel 10. The space area V may overlap the through portion TP of the display panel 10.

In an embodiment, an angle θ between the edge CAE1 of the first connection area CA1 and the edge PAE2 of the second pixel area PA2 may be an acute angle. When a tensile force and/or a contractile force are/is exerted on the display panel 10, the angle θ between the edge CAE1 of the first connection area CA1 and the edge PAE2 of the second pixel area PA2 may be changed.

The first pixel PX1 and the second pixel PX2 may overlap the first pixel area PA1 and the second pixel area PA2, respectively. In an embodiment, each of the first pixel PX1 and the second pixel PX2 may include a red sub-pixel, a green sub-pixel, and a blue sub-pixel. In an alternative embodiment, each of the first pixel PX1 and the second pixel PX2 may include a red sub-pixel, a green sub-pixel, a blue sub-pixel, and a white sub-pixel.

FIG. 10 shows a structure of the display panel 10 in the corner display area CDA in FIG. 7. In an embodiment, a structure of the display panel 10 in the central display area CTDA in FIG. 7 may be same as or similar to the structure of the display panel 10 described with reference to FIG. 10.

Figure 11:
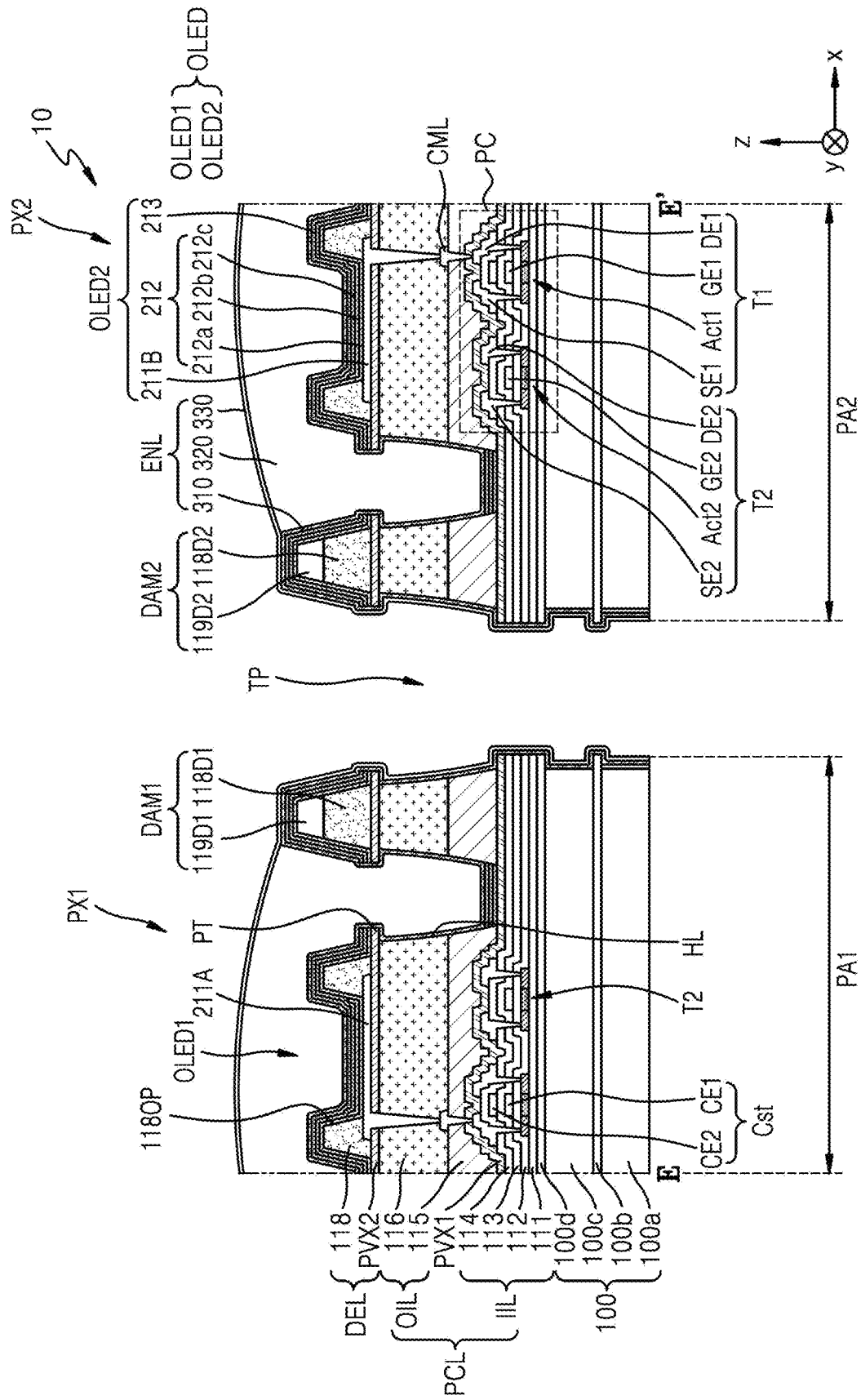
FIG. 11 is a cross-sectional view schematically illustrating the display panel in FIG. 10, taken along line E-E' in FIG. 10.

FIG. 11 is a cross-sectional view schematically illustrating the display panel 10 in FIG. 10, taken along line E-E' in FIG. 10. In FIG. 11, the same or like reference numerals as those of FIG. 9 denote the same or like elements, and any repetitive detailed descriptions thereof will be omitted.

Referring to FIG. 11, an embodiment of the display panel 10 may have the through portion TP. The first pixel area PA1 and the second pixel area PA2 may be separated from each other with the through portion TP therebetween. An edge of the first pixel area PA1 and an edge of the second pixel area PA2 may define at least a portion of the through portion TP.

The display panel 10 may include the substrate 100, the pixel circuit layer PCL, the display element layer DEL, and the encapsulation layer ENL. In an embodiment, the substrate 100, the pixel circuit layer PCL, the display element layer DEL, and the encapsulation layer ENL may be separated from each other with the through portion TP therebetween. In an embodiment, the pixel circuit layer PCL may further include a first inorganic layer PVX1. In an embodiment, the display element layer DEL may further include a second inorganic layer PVX2.

Hereinafter, a stacked structure of an embodiment of the display panel 10 including the through portion TP will be described in detail. However, the stacked structure of an embodiment of the display panel 10 including the through portion TP is not limited thereto, and may be variously modified.

In an embodiment, a hole HL is defined through the organic insulating layer OIL. In an embodiment, the hole HL may be provided by overlapping a hole in the first organic insulating layer 115 and a hole in the second organic insulating layer 116. In an alternative embodiment, the hole HL may be defined in the second organic insulating layer 116. In such an embodiment, an upper surface of the first organic insulating layer 115 may be exposed by the hole in the second organic insulating layer 116. Hereinafter, embodiments where the hole HL is defined in the first organic insulating layer 115 and the second organic insulating layer 116 will be mainly described in detail.

In an embodiment, the organic insulating layer OIL may have a groove in a thickness direction of the organic insulating layer OIL, instead of the hole HL. In an embodiment, the organic insulating layer OIL may not have the hole HL or the groove.

In an embodiment, the first inorganic layer PVX1 may be disposed or arranged between the interlayer insulating layer 114 and the first organic insulating layer 115. The first inorganic layer PVX1 may cover the first source electrode SE1, the first drain electrode DE1, the second source electrode SE2, and the second drain electrode DE2. In an embodiment, a contact hole is defined through the first inorganic layer PVX1 such that the first source electrode SE1 or the first drain electrode DE1 are electrically connected to the connection electrode CML through the contact hole.

In an alternative embodiment, the first inorganic layer PVX1 may be arranged between the first organic insulating layer 115 and the second organic insulating layer 116. In such an embodiment, the first inorganic layer PVX1 may cover the connection electrode CML. At least a portion of the first inorganic layer PVX1 may be exposed by the hole HL. The first inorganic layer PVX1 may have a single layer structure or a multilayer structure, each layer including an inorganic material such as $SiN_X$ and/or $SiO_2$. In an alternative embodiment, the first inorganic layer PVX1 may be omitted.

The organic light-emitting diode OLED may be disposed or arranged on the second organic insulating layer 116. The organic light-emitting diode OLED may include a first organic light-emitting diode OLED1 and a second organic light-emitting diode OLED2. The first organic light-emitting diode OLED1 as a first display element may be arranged on the substrate 100 to overlap the first pixel area PA1. The first organic light-emitting diode OLED1 may implement the first pixel PX1. The second organic light-emitting diode OLED2 as a second display element may be disposed or arranged on the substrate 100 to overlap the second pixel area PA2. The second organic light-emitting diode OLED2 may implement the second pixel PX2.

The first organic light-emitting diode OLED1 may include a first pixel electrode 211A, the intermediate layer 212, and the opposite electrode 213. The second organic light-emitting diode OLED2 may include a second pixel electrode 211B, the intermediate layer 212, and the opposite electrode 213. The first pixel electrode 211A and the second pixel electrode 211B may be connected to the connection electrode CML through a contact hole defined in the second organic insulating layer 116.

The second inorganic layer PVX2 may be disposed or arranged between the organic light-emitting diode OLED and the second organic insulating layer 116. The second inorganic layer PVX2 may include a plurality of inorganic patterns apart from one another on the second organic insulating layer 116. The second inorganic layer PVX2 may have a protrusion tip PT protruding in a center direction of the hole HL. Thus, a lower surface of the protrusion tip PT may be exposed through the hole HL. In such an embodiment, the hole HL may have an undercut structure. The second inorganic layer PVX2 may include have a single layer structure or a multilayer structure, each layer including an inorganic material such as $SiN_X$ and/or $SiO_2$.

The hole HL and the protrusion tip PT of the second inorganic layer PVX2 may have a structure for disconnecting each the first functional layer 212a and the second functional layer 212c. In an embodiment, the first functional layer 212a, the second functional layer 212c, and the opposite electrode 213 may be disposed on an entire surface of the substrate 100. In such an embodiment, the first functional layer 212a and the second functional layer 212c may include an organic material, and external oxygen, moisture, or the like may flow into the organic light-emitting diode OLED from the through portion TP through at least one of the first functional layer 212a and the second functional layer 212c. The oxygen or moisture may damage the organic light-emitting diode OLED. The hole HL and the protrusion tip PT of the second inorganic layer PVX2 may disconnect each of the first functional layer 212a and the second functional layer 212c, and a first functional layer pattern and a second functional layer pattern may be disposed within the hole HL. Thus, the inflow of moisture or oxygen to the organic light-emitting diode OLED from the through portion TP may be prevented, and thus, damage to the organic light-emitting diode OLED may be prevented. However, a structure of disconnecting each of the first functional layer 212a and the second functional layer 212c is not limited thereto, and various structures for disconnecting each of the first functional layer 212a and the second functional layer 212c may be applied to the display panel 10.

A first dam portion DAM1 and a second dam portion DAM2 may be arranged on the second inorganic layer PVX2. Each of the first dam portion DAM1 and the second dam portion DAM2 may protrude in a thickness direction of the substrate 100 from the second inorganic layer PVX2. The first dam portion DAM1 and the second dam portion DAM2 may be disposed adjacent to the through portion TP.

The first dam portion DAM1 may be disposed or arranged on the first pixel area PA1. In an embodiment, the first dam portion DAM1 may surround the first organic light-emitting diode OLED1. The first dam portion DAM1 may be disposed closer to the through portion TP than the hole HL. The first dam portion DAM1 may include a first pattern layer 118D1 and a first upper pattern layer 119D1. In an embodiment, the first pattern layer 118D1 may include a same material as the pixel-defining layer 118. The first upper pattern layer 119D1 may include an organic insulating material and/or an inorganic insulating material.

The second dam portion DAM2 may be disposed or arranged on the second pixel area PA2. In an embodiment, the second dam portion DAM2 may surround the second organic light-emitting diode OLED2. The second dam portion DAM2 may be arranged closer to the through portion TP than the hole HL. The second dam portion DAM2 may include a second pattern layer 118D2 and a second upper pattern layer 119D2. In an embodiment, the second pattern layer 118D2 may include a same material as the pixel-defining layer 118 and the first pattern layer 118D1. The pixel-defining layer 118, the first pattern layer 118D1, and the second pattern layer 118D2 may be provided during a same process. The second upper pattern layer 119D2 may include an organic insulating material and/or an inorganic insulating material. The second upper pattern layer 119D2 may include a same material as the first upper pattern layer 119D1. The first upper pattern layer 119D1 and the second upper pattern layer 119D2 may be provided during a same process. In an alternative embodiment, at least one of the first dam portion DAM1 and the second dam portion DAM2 may be omitted.

The encapsulation layer ENL may cover the first organic light-emitting diode OLED1 and the second organic light-emitting diode OLED2. The encapsulation layer ENL may be arranged on the opposite electrode 213. The encapsulation layer ENL may be separated with the through portion TP therebetween. In an embodiment, the encapsulation layer ENL may include at least one inorganic encapsulation layer and at least one organic encapsulation layer. FIG. 11 shows an embodiment where the encapsulation layer ENL includes the first inorganic encapsulation layer 310, the organic encapsulation layer 320, and the second inorganic encapsulation layer 330 that are sequentially stacked one on another.

The first inorganic encapsulation layer 310 may cover the organic light-emitting diode OLED. The first inorganic encapsulation layer 310 may entirely and continuously cover the substrate 100. The first inorganic encapsulation layer 310 may cover the first organic light-emitting diode OLED1, the hole HL, the first dam portion DAM1, the second dam portion DAM2, and the second organic light-emitting diode OLED2. The first inorganic encapsulation layer 310 may contact with the protrusion tip PT of the second inorganic layer PVX2. The first inorganic encapsulation layer 310 may contact with the first inorganic layer PVX1. Thus, moisture or oxygen may be prevented from entering the organic light-emitting diode OLED from the through portion TP through a layer including an organic material. In such an embodiment, the first inorganic encapsulation layer 310 may be separated with respect to the through portion TP.

The organic encapsulation layer 320 may be disposed or arranged on the first inorganic encapsulation layer 310. The organic encapsulation layer 320 may overlap the first organic light-emitting diode OLED1 and the second organic light-emitting diode OLED2, and the organic encapsulation layer 320 may fill the hole HL. In an embodiment, the organic encapsulation layer 320 may be separated with respect to the through portion TP. In one embodiment, for example, the organic encapsulation layer 320 overlapping the first organic light-emitting diode OLED1 may extend up to the first dam portion DAM1. The organic encapsulation layer 320 overlapping the second organic light-emitting diode OLED2 may extend up to the second dam portion DAM2. The first dam portion DAM1 and the second dam portion DAM2 protrude in the thickness direction of the substrate 100 from an upper surface of the second inorganic layer PVX2, thus controlling a flow of the organic encapsulation layer 320.

The second inorganic encapsulation layer 330 may cover the organic encapsulation layer 320. The second inorganic encapsulation layer 330 may entirely and continuously cover the substrate 100. The second inorganic encapsulation layer 330 may contact with the first inorganic encapsulation layer 310 on the first dam portion DAM1 and the second dam portion DAM2. Thus, the organic encapsulation layer 320 may be separated by the first dam portion DAM1 and the second dam portion DAM2. In such an embodiment, the second inorganic encapsulation layer 330 may be separated with respect to the through portion TP.

Hereinafter, an embodiment of a method for controlling a display device in which the display device 1 is controlled such that the display panel 10 is bent, and/or an embodiment of the display device 1 including the display panel 10 in a bent state will be described.

Figure 12:
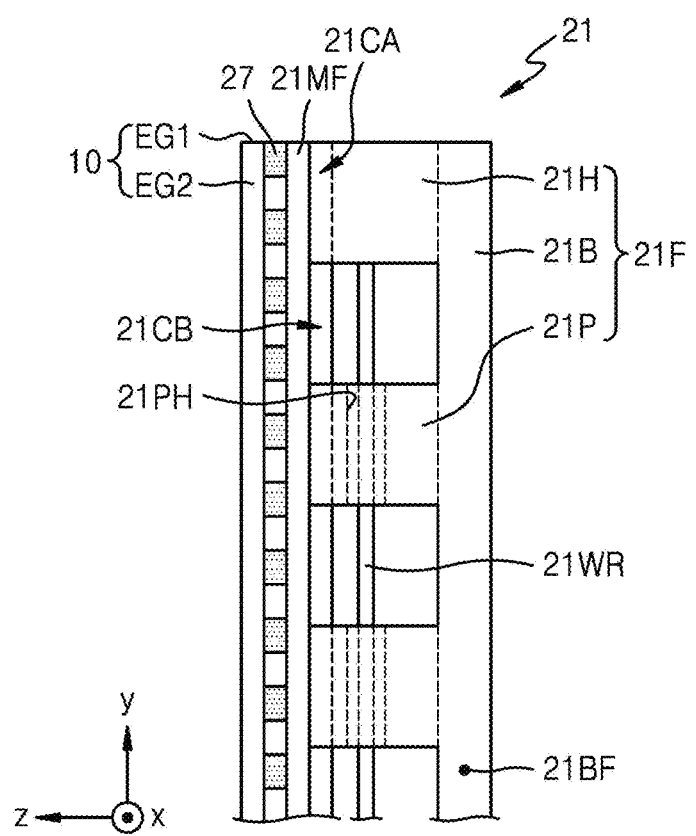
FIG. 12 is a side view schematically illustrating a shape of a display panel and a frame set before being bent.

FIG. 12 is a side view schematically illustrating a shape of the display panel 10 and the frame set 21 before the display panel 10 and the frame set 21 are bent.

Referring to FIG. 12, in an embodiment, the display panel 10 may display images. The display panel 10 may include edges. In an embodiment, the display panel 10 may include the first edge EG1 extending in the first direction (for example, the x direction or the −x direction), and the second edge EG2 extending in the second direction (for example, the y direction or the −y direction).

The frame set 21 may be disposed or arranged on the display panel 10. The frame set 21 may be disposed on the rear side of the display panel 10. In an embodiment, the frame set 21 may include the frame 21F, the wire 21WR, and the intermediate frame 21MF. The frame 21F may include the body 21B, the head 21H, and the protrusion pattern 21P. The body 21B may extend in a longitudinal direction. The body 21B may have a fixed point 21BF. The fixed point 21BF may include a point where a portion of the body 21B is fixed relative to the head 21H. The head 21H may protrude toward the rear side of the display panel 10 from the body 21B. The protrusion pattern 21P may protrude toward the rear side of the display panel 10, and may be apart from the head 21H in the longitudinal direction of the frame 21F. In an embodiment, the through hole 21PH may be defined through the protrusion pattern 21P.

The wire 21WR may extend in the longitudinal direction of the frame 21F. The wire 21WR may be fixed to the head 21H. In an embodiment, the wire 21WR may extend between the display panel 10 and the body 21B and may be fixed to the head 21H. In an embodiment, the wire 21WR may extend through the through hole 21PH.

The intermediate frame 21MF may be disposed between the display panel 10 and the frame 21F. In an embodiment, the intermediate frame 21MF may be arranged between the plurality of supporters 27 and the frame 21F. In an embodiment, the intermediate frame 21MF may be fixed to the plurality of supporters 27.

One of the head 21H and the intermediate frame 21MF may have the concave portion 21CA facing the other one of the head 21H and the intermediate frame 21MF. In addition, the other one of the head 21H and the intermediate frame 21MF may have the convex portion 21CB facing the concave portion 21CA. In one embodiment, for example, the head 21H may have the concave portion 21CA, and the intermediate frame 21MF may have the convex portion 21CB.

Figure 13:
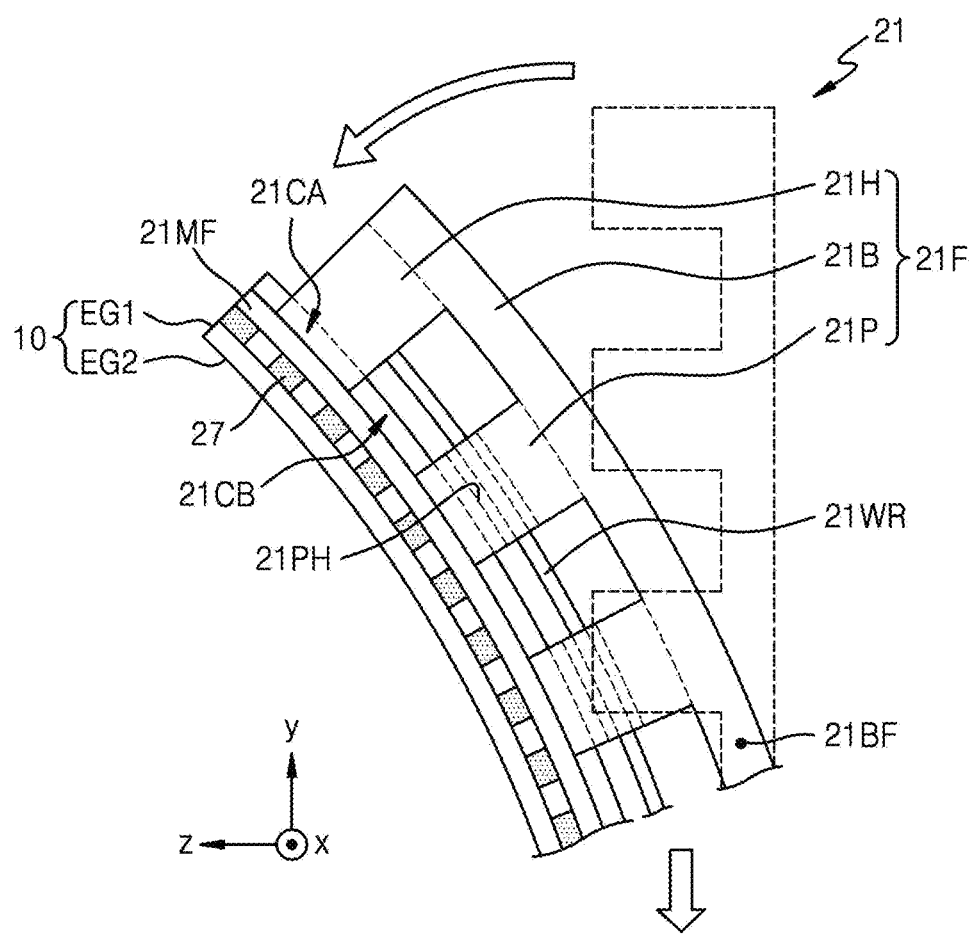
FIG. 13 is a side view illustrating an embodiment in which a frame is bent by adjusting a length of a wire.
Figure 14A:
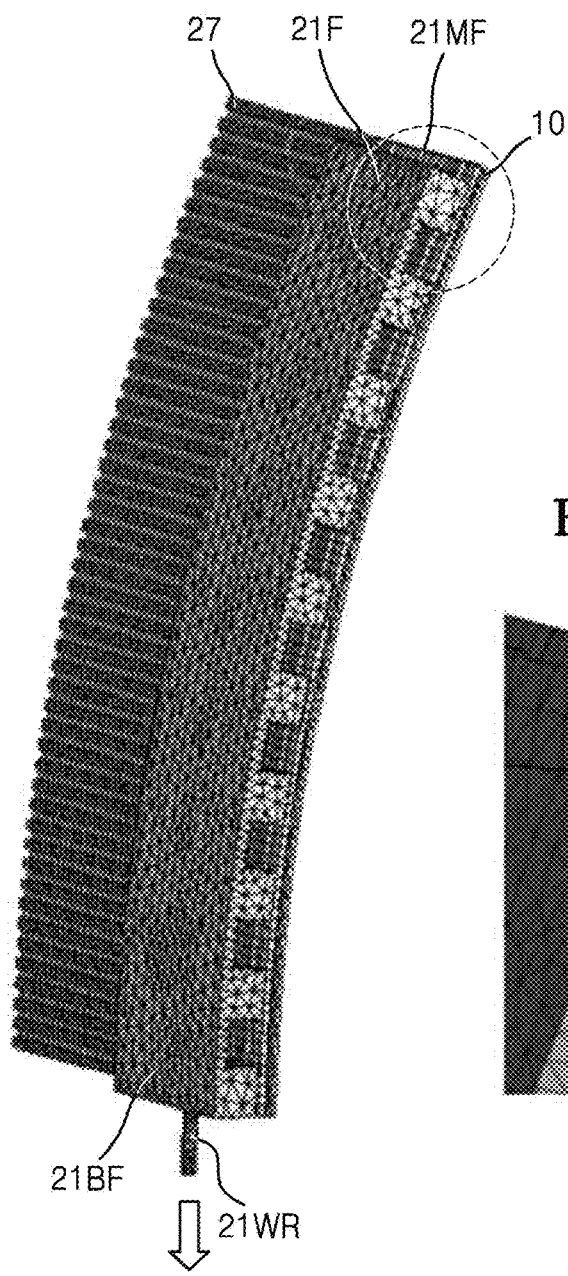
FIG. 14A is a simulation result illustrating bending of a frame by adjusting a length of a wire.

FIG. 13 is a side view illustrating bending of the frame 21F by adjusting a length of the wire 21WR. FIG. 14A is a simulation result illustrating that the frame 21F is bent by adjusting a length of the wire 21WR, and FIG. 14B is an enlarged view of the encircled portion of FIG. 14A.

Figure 14B:
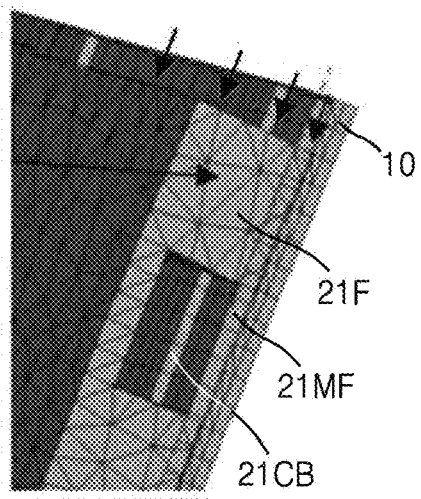
FIG. 14B is an enlarged view of the encircled portion of FIG. 14A.

Referring to FIGS. 13, 14A and 14B, the frame 21F may be bent by adjusting the length of the wire 21WR, and the frame 21F may bend the display panel 10.

The length of the wire 21WR may be adjusted by the controller. When the length of the wire 21WR decreases, the frame 21F may be bent. The wire 21WR extends between the display panel 10 and the body 21B and is fixed to the head 21H, and thus, a torsion moment may be applied to the frame 21F. Due to the torsion moment, the frame 21F may be bent.

The intermediate frame 21MF may be disposed between the display panel 10 and the frame 21F. The intermediate frame 21MF may prevent or reduce the concentration of a strain on at least a portion of the display panel 10 and/or the plurality of supporters 27 due to the frame 21F.

When the frame 21F is bent, the intermediate frame 21MF may move relative to the head 21H. The intermediate frame 21MF and the head 21H may not be fixed to each other, and thus, the intermediate frame 21MF may move relative to the head 21H. Thus, the display panel 10 may be bent a preset value or less and not be damaged.

When the frame 21F is bent, in the concave portion 21CA, the convex portion 21CB may move relative to the concave portion 21CA. In this case, the concave portion 21CA and the convex portion 21CB may guide the head 21H and the intermediate frame 21MF to move relatively in one direction. Thus, the concave portion 21CA and the convex portion 21CB may increase the reliability of the frame set 21.

At least one of the plurality of supporters 27 may move in the third direction (for example, the z direction or the −z direction). In one embodiment, for example, the supporter 27 arranged adjacent to the first edge EG1 among the plurality of supporters 27 may move in the third direction (for example, the z direction or the −z direction). In an embodiment, the frame set 21 may move the at least one of the plurality of supporters 27 in the third direction (for example, the z direction or the −z direction). Thus, the display panel 10 may be bent.

Figure 15:
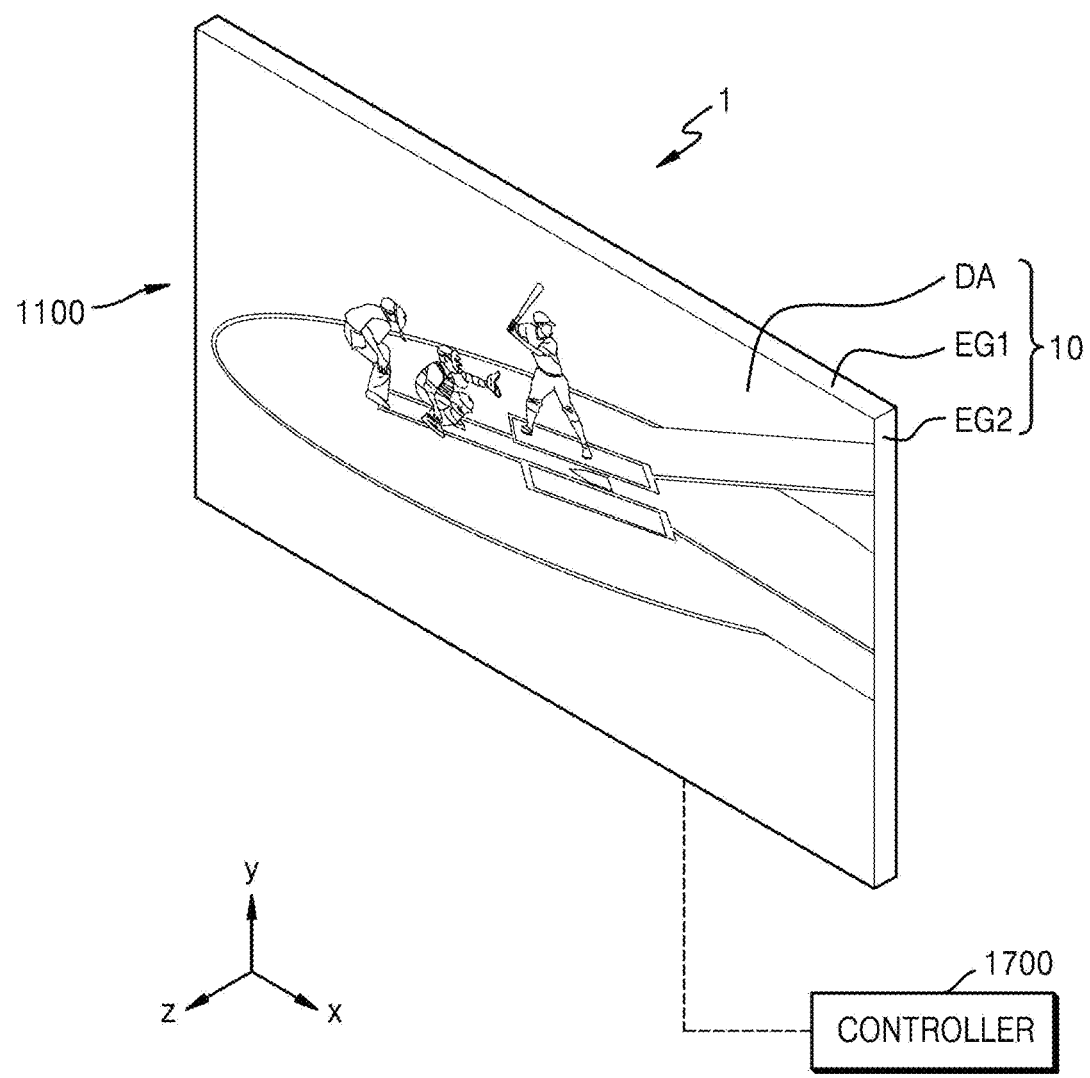
FIG. 15 is a perspective view schematically illustrating a shape of a display device for displaying an image before the display device is bent.
Figure 16:
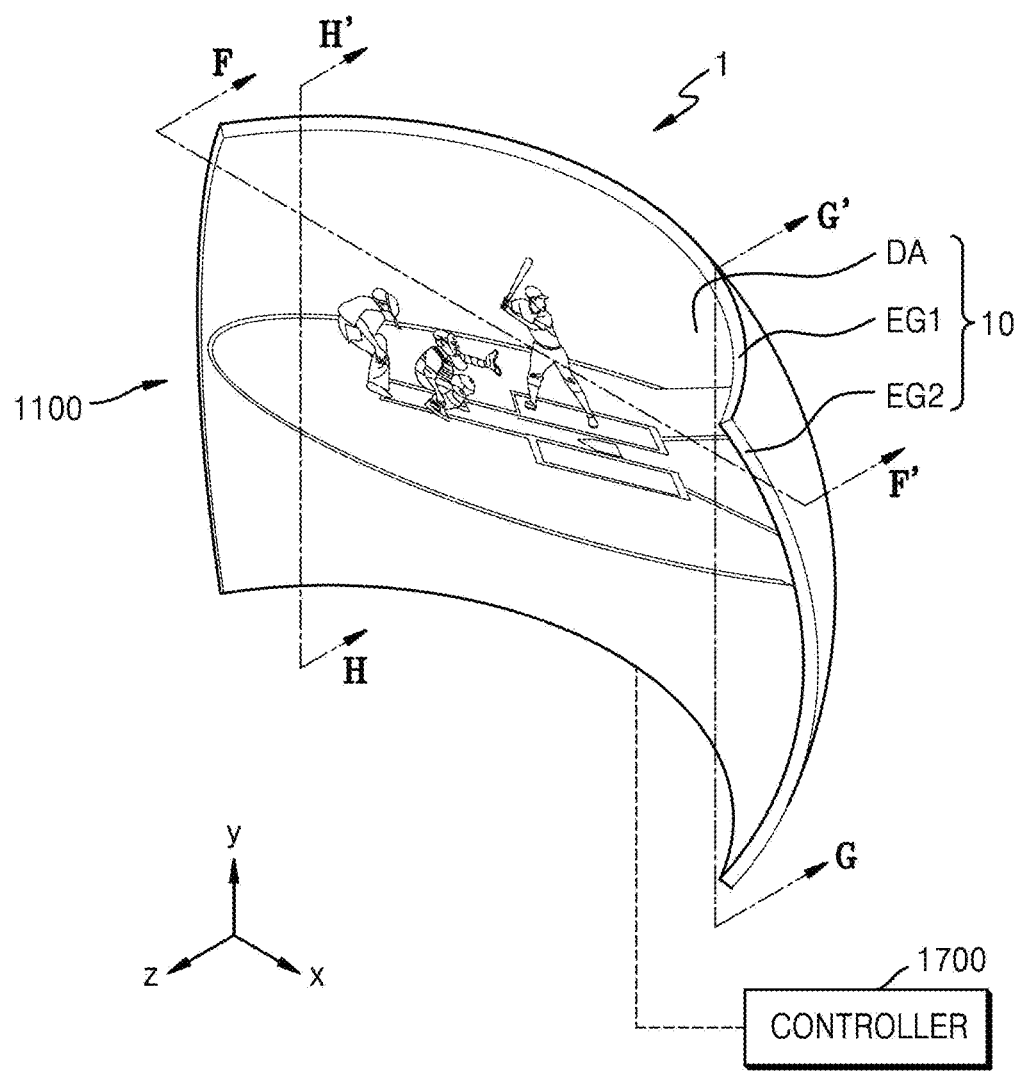
FIGS. 16 and 17 are perspective views schematically illustrating a shape of a display device for displaying an image after the display device is bent.
Figure 17:
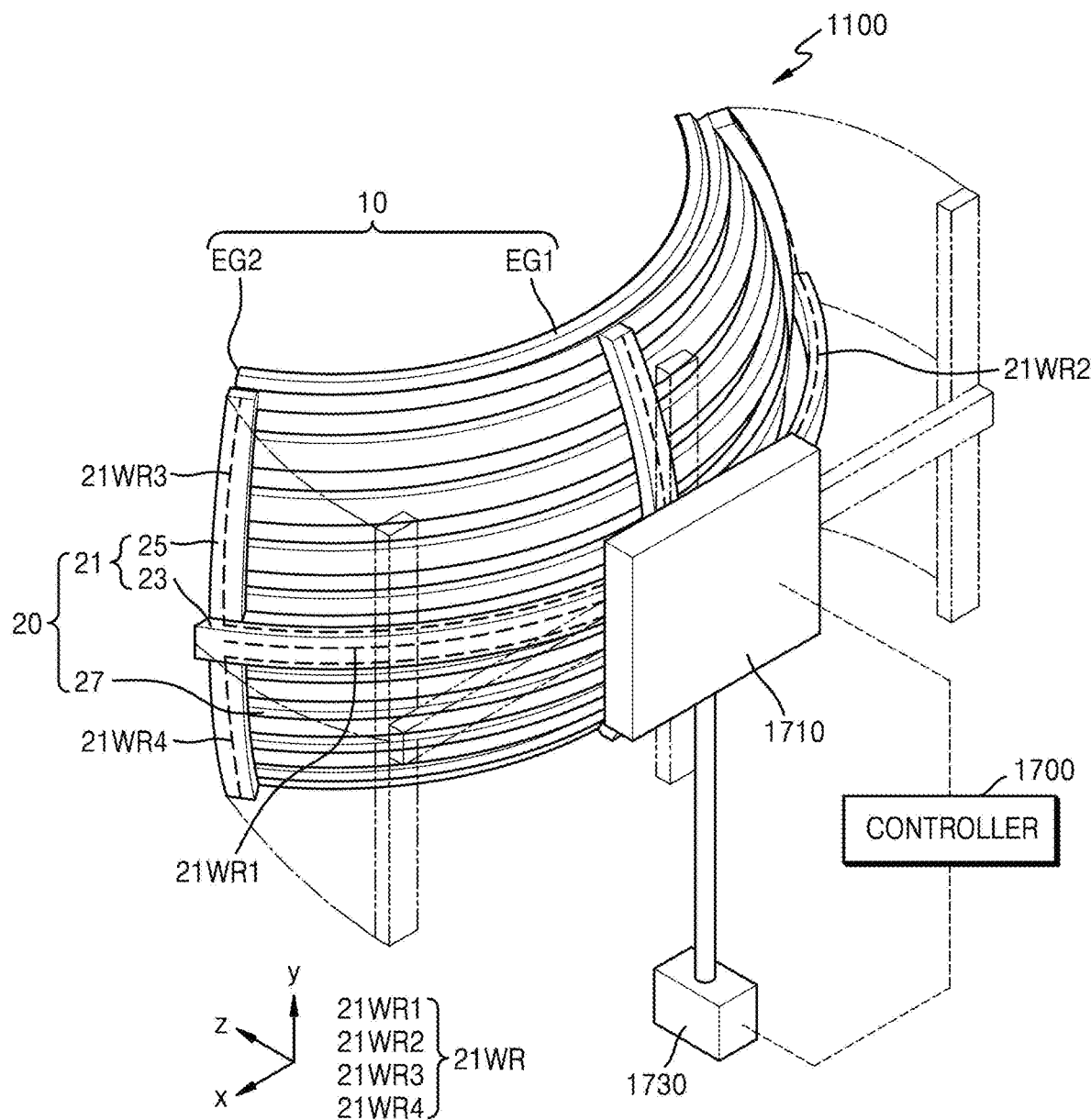

FIG. 15 is a perspective view schematically illustrating a shape of the display device 1 for displaying an image before the display device 1 is bent. FIGS. 16 and 17 are perspective views schematically illustrating a shape of the display device 1 for displaying an image after the display device 1 is bent. FIG. 16 is a perspective view of a front surface of the display unit 1100, and FIG. 17 is a perspective view of a rear surface of the display unit 1100.

Referring to FIG. 15, an image may be displayed in the display area DA of the display panel 10. The display panel 10 may include edges. In an embodiment, the display panel 10 may include the first edge EG1 extending in the first direction (for example, the x direction or the −x direction), and the second edge EG2 extending in the second direction (for example, the y direction or the −y direction).

In an embodiment where the first edge EG1 extends in the first direction (for example, the x direction or the −x direction) and the second edge EG2 extends in the second direction (for example, the y direction or the −y direction), the display area DA of the display panel 10 may include a flat surface. When the display area DA includes a flat surface, a sense of distortion experienced when a plurality of users view an image displayed in the display area DA may be prevented or reduced. In addition, in the display device 1, even when an image is viewed from various angles, a sense of distortion experienced by the user may be prevented or reduced.

The controller 1700 may obtain information to bend the display panel 10. In an embodiment, the information obtained to bend the display panel 10 may include information corresponding to a manipulation of a remote controller connected to the display device 1. In an alternative embodiment, the information obtained to bend the display panel 10 may include information corresponding to a voice signal of a user viewing the image. In another alternative embodiment, the information obtained to bend the display panel 10 may include information about a type of content included in the image. In another alternative embodiment, the information obtained to bend the display panel 10 may include position information of at least one user viewing the image. In one embodiment, for example, the position information of the at least one user may include position information of a single user. In another alternative embodiment, the position information of the at least one user may include position information of a plurality of users.

Referring to FIG. 16, the display panel 10 may be bent. In an embodiment, when the display panel 10 is in a bent state, the first edge EG1 may have a curvature. In this case, a position of one point of the second edge EG2 may be changed in the first direction (for example, the x direction or the −x direction). The position of the one point of the second edge EG2 may be changed in a direction approaching a center of the display panel 10. In addition, the position of the one point of the second edge EG2 may be changed in the third direction (for example, the z direction or the −z direction). In one embodiment, for example, the position of the one point of the second edge EG2 may be changed in a z direction in FIG. 16.

In an embodiment, when the display panel 10 is in a bent state, the second edge EG2 may have a curvature. In this case, a position of one point of the first edge EG1 may be changed in the second direction (for example, the y direction or the −y direction). The position of the one point of the first edge EG1 may be changed in a direction approaching the center of the display panel 10. In addition, the position of the one point of the first edge EG1 may be changed in the third direction (for example, the z direction or the −z direction). In one embodiment, for example, the position of the one point of the first edge EG1 may be changed in the z direction in FIG. 16. Thus, the display panel 10 may be changed to a concave shape. In this case, the immersiveness experienced by a user that views an image displayed in the display area DA may increase.

Embodiments of the disclosure may include a state in which the display panel 10 is in a flat state or a state in which the display panel 10 is bent in a concave shape. Thus, a size of a space occupied by the display device 1 may be adjusted.

In an embodiment, as shown in FIGS. 15 and 16, the display panel 10 is changed from a flat shape to a concave shape, but the display panel 10 may be changed from the concave shape to the flat shape.

Referring to FIG. 17, the frame set 21 may bend the display panel 10. In an embodiment, the frame set 21 may be provided in plural. In such an embodiment, the frame set 21 may include the plurality of frame sets 21. In an embodiment, the plurality of frame sets 21 may include the first frame set 23 and the second frame set 25. In such an embodiment, the frame set 21 may include the first frame set 23 and the second frame set 25. In an embodiment, at least one of the first frame set 23 and the second frame set 25 may bend the display panel 10. In an embodiment, the first frame set 23 and the second frame set 25 may bend the display panel 10 so that each of the first edge EG1 and the second edge EG2 has a curvature.

The first frame set 23 may extend in the first direction (for example, the x direction or the −x direction). The first frame set 23 may be bent from the first direction (for example, the x direction or the −x direction) to the third direction (for example, the z direction or the −z direction). The first frame set 23 may be bent under the control of the controller 1700. Thus, the first frame set 23 may bend the display panel 10 from the first direction (for example, the x direction or the −x direction) to the third direction (for example, the z direction or the −z direction). In addition, the first frame set 23 may bend the display panel 10 so that the first edge EG1 of the display panel 10 has a curvature.

The second frame set 25 may extend in the second direction (for example, the y direction or the −y direction). The second frame set 25 may be bent from the second direction (for example, the y direction or the −y direction) to the third direction (for example, the z direction or the −z direction). The second frame set 25 may be bent under the control of the controller 1700. Thus, the second frame set 25 may bend the display panel 10 from the second direction (for example, the y direction or the −y direction) to the third direction (for example, the z direction or the −z direction). In addition, the second frame set 25 may bend the display panel 10 so that the second edge EG2 of the display panel 10 has a curvature.

The wire 21WR may bend the first frame set 23 and/or the second frame set 25. In one embodiment, for example, when the wire 21WR is contracted or when the length of the wire 21WR is reduced by a motor, the first frame set 23 and/or the second frame set 25 may be bent.

In an embodiment, the wire 21WR may include the first wire 21WR1, a second wire 21WR2, the third wire 21WR3, and the fourth wire 21WR4. In an embodiment, a length of the first wire 21WR1, a length of the second wire 21WR2, a length of the third wire 21WR3, and a length of the fourth wire 21WR4 may be adjusted independent of one another.

The first wire 21WR1 and the second wire 21WR2 may bend a frame included in the first frame set 23. In an embodiment, the length of the first wire 21WR1 and the length of the second wire 21WR2 may be adjusted independent of each other. In an embodiment, a degree of bending of the first frame set 23 extending in the −x direction and a degree of bending of the first frame set 23 extending in the x direction may be different from each other. In an embodiment, the third wire 21WR3 and the fourth wire 21WR4 may bend a frame included in the second frame set 25. In an embodiment, the length of the third wire 21WR3 and the length of the fourth wire 21WR4 may be adjusted independent of each other. In such an embodiment, a degree of bending of the second frame set 25 extending in the y direction and a degree of bending of the second frame set 25 extending in the −y direction may be different from each other.

In an embodiment, the plurality of supporters 27 may be arranged side by side in the second direction (for example, the y direction or the −y direction).

The plurality of supporters 27 may be bent from the first direction (for example, the x direction or the −x direction) to the third direction (for example, the z direction or the −z direction). In an embodiment, the first frame set 23 may bend the plurality of supporters 27 from the first direction (for example, the x direction or the −x direction) to the third direction (for example, the z direction or the −z direction). In one embodiment, for example, when the first frame set 23 is bent from the first direction (for example, the x direction or the −x direction) to the third direction (for example, the z direction or the −z direction), the plurality of supporters 27 may also be bent from the first direction (for example, the x direction or the −x direction) to the third direction (for example, the z direction or the −z direction). Thus, the display panel 10 may be bent from the first direction (for example, the x direction or the −x direction) to the third direction (for example, the z direction or the −z direction).

At least one of the plurality of supporters 27 may move in the third direction (for example, the z direction or the −z direction). In one embodiment, for example, the supporter 27 arranged adjacent to the first edge EG1 among the plurality of supporters 27 may move in the third direction (for example, the z direction or the −z direction). In an embodiment, the second frame set 25 may move the at least one of the plurality of supporters 27 in the third direction (for example, the z direction or the −z direction). In one embodiment, for example, when the second frame set 25 is bent from the second direction (for example, the y direction or the −y direction) to the third direction (for example, the z direction or the −z direction), the at least one of the plurality of supporters 27 may move to the third direction (for example, the z direction or the −z direction). Thus, the display panel 10 may be bent from the second direction (for example, the y direction or the −y direction) to the third direction (for example, the z direction or the −z direction).

In an embodiment, the controller 1700 may include a first driving unit 1710 and a second driving unit 1730. The first driving unit 1710 may control the frame assembly 20. In an embodiment, the first driving unit 1710 may control bending of the first frame set 23 and/or the second frame set 25. In an embodiment, the first driving unit 1710 may include a motor. The motor may contract the wire 21WR, or may wind the wire 21WR and reduce the length of the wire 21WR.

In an embodiment, the first driving unit 1710 may include a plurality of motors. The plurality of motors may control bending of each of the first frame set 23 and the second frame set 25. In an embodiment, the plurality of motors may control bending of one frame set 21. In one embodiment, for example, where the plurality of motors control the first frame set 23, bending of both ends of the first frame set 23 may be adjusted independent of each other. The plurality of motors may adjust each of the length of the first wire 21WR1 and the length of the second wire 21WR2. In one alternative embodiment, for example, where the plurality of motors control the second frame set 25, bending of both ends of the second frame set 25 may be adjusted independent of each other. The plurality of motors may adjust each of the length of the third wire 21WR3 and the length of the fourth wire 21WR4. Thus, the display panel 10 may be bent in various shapes.

The second driving unit 1730 may control the display unit 1100 to rotate about the second direction (for example, the y direction or the -y direction) as an axis. In an embodiment, the second driving unit 1730 may include a motor. The motor may rotate the display unit 1100 about the second direction (for example, the y direction or the -y direction) as an axis. Accordingly, the display panel 10 may rotate about the second direction (for example, the y direction or the -y direction) as an axis by the controller 1700.

Figure 18A:
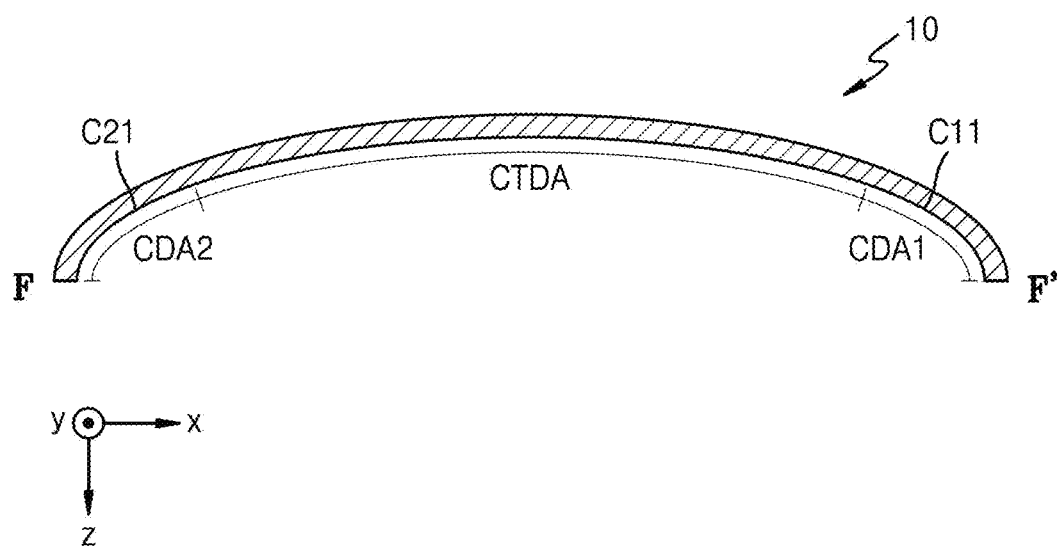
FIG. 18A is a cross-sectional view of the bent display panel in FIG. 16, taken along line F-F' in FIG. 16.
Figure 18B:
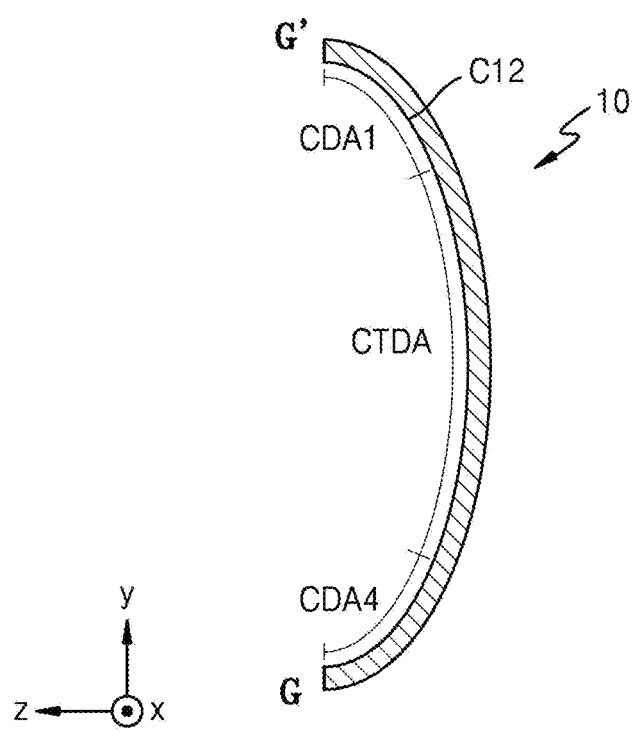
FIG. 18B is a cross-sectional view of the bent display panel in FIG. 16, taken along line G-G' in FIG. 16.
Figure 18C:
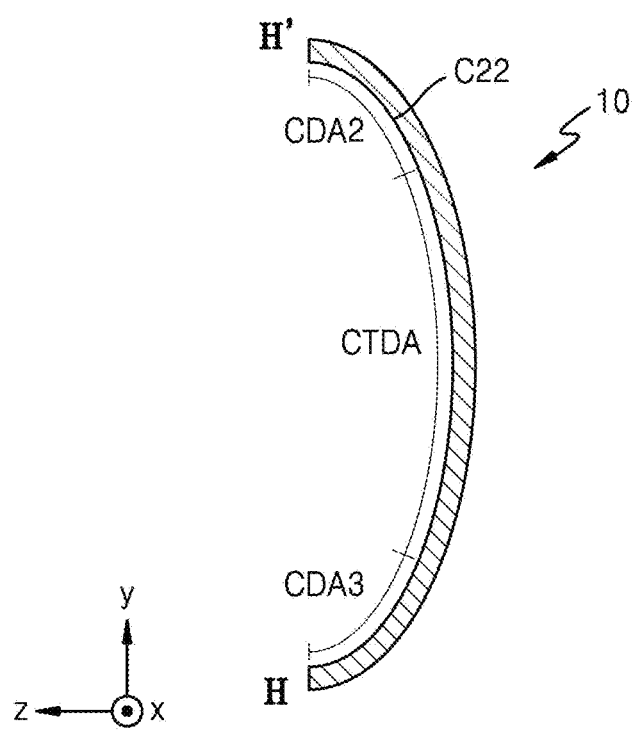
FIG. 18C is a cross-sectional view of the bent display panel in FIG. 16, taken along line H-H' in FIG. 16.

FIG. 18A is a cross-sectional view of the display panel 10 that is bent, in FIG. 16, taken along line F-F' in FIG. 16. FIG. 18B is a cross-sectional view of the display panel 10 that is bent, in FIG. 16, taken along line G-G' in FIG. 16. FIG. 18C is a cross-sectional view of the display panel 10 in a bent state, in FIG. 16, taken along line H-H' in FIG. 16. In FIGS. 18A to 18C, the same or like reference numerals as those of FIG. 7 denote the same or like elements, and any repetitive detailed descriptions thereof will be omitted.

Referring to FIGS. 18A to 18C, an embodiment of the display panel 10 may include a display area. The display area may have a concave shape in the display panel 10 in a bent state. The display area may include the central display area CTDA and a corner display area. The central display area CTDA may be arranged in the center of the display panel 10. The corner display area may be arranged between the central display area CTDA and a corner where the edges of the display panel 10 meet.

The display panel 10 may include a plurality of corner display areas. In one embodiment, for example, the display panel 10 may include the first corner display area CDA1, the second corner display area CDA2, the third corner display area CDA3, and the fourth corner display area CDA4.

The corner display areas may have a first-direction curvature and a second-direction curvature. Herein, the first-direction curvature may be defined as a curvature on a cross-section (for example, an x-z cross-section) in the first direction (for example, the x direction or the -x direction). The second-direction curvature may be defined as a curvature on a cross-section (for example, a y-z cross-section) in the second direction (for example, the y direction or the -y direction).

In an embodiment, the first corner display area CDA1 may have a first-direction first-curvature C11 and a second-direction first-curvature C12. In an embodiment, the second corner display area CDA2 may have a first-direction second-curvature C21 and a second-direction second-curvature C22. In an embodiment, the third corner display area CDA3 may have a first-direction third-curvature and a second-direction third-curvature. In an embodiment, the fourth corner display area CDA4 may have a first-direction fourth-curvature and a second-direction fourth-curvature.

Thus, the display panel 10 in a bent state may be concave when viewed from the cross-section (for example, the x-z cross-section) in the first direction (for example, the x direction or the -x direction). The display panel 10 in a bent state may be concave when viewed from the cross-section (for example, the y-z cross-section) in the second direction (for example, the y direction or the -y direction).

In an embodiment, at least one of the plurality of corner display areas may not have the first-direction curvature. In an embodiment, at least one of the plurality of corner display areas may not have the second-direction curvature.

In an embodiment, a first-direction curvature of one of the plurality of corner display areas may be equal to a first-direction curvature of the other one of the plurality of corner display areas. The first-direction first-curvature C11 of the first corner display area CDA1 may be equal to the first-direction second-curvature C21 of the second corner display area CDA2. In an alternative embodiment, a first-direction curvature of one of the plurality of corner display areas may be different from a first-direction curvature of the other one of the plurality of corner display areas. In one embodiment, for example, the first-direction first-curvature C11 of the first corner display area CDA1 may be different from the first-direction second-curvature C21 of the second corner display area CDA2. The first-direction first-curvature C11 of the first corner display area CDA1 may be either less than or greater than the first-direction second-curvature C21 of the second corner display area CDA2. First-direction curvatures of the plurality of corner display areas may be adjusted by controlling the first frame set 23 of FIG. 17 by the controller 1700.

In an embodiment, a second-direction curvature of one of the plurality of corner display areas may be equal to a second-direction curvature of the other one of the plurality of corner display areas. In one embodiment, for example, the second-direction first-curvature C12 of the first corner display area CDA1 may be equal to the second-direction second-curvature C22 of the second corner display area CDA2. In an alternative embodiment, a second-direction curvature of one of the plurality of corner display areas may be different from a second-direction curvature of the other one of the plurality of corner display areas. In one embodiment, for example, the second-direction first-curvature C12 of the first corner display area CDA1 may be different from the second-direction second-curvature C22 of the second corner display area CDA2. The second-direction first-curvature C12 of the first corner display area CDA1 may be either less than or greater than the second-direction second-curvature C22 of the second corner display area CDA2. Second-direction curvatures of the plurality of corner display areas may be adjusted by controlling the second frame set 25 of FIG. 17 by the controller 1700.

The display panel 10 may include a structure and/or a material that may be stretched and/or contracted. Thus, the display panel 10 may be bent from the first direction (for example, the x direction or the -x direction) to the third direction (for example, the z direction or the -z direction), and may be bent from the second direction (for example, the y direction or the -y direction) to the third direction (for example, the z direction or the -z direction). The controller 1700 may control the first frame set 23 and the second frame set 25 to bend the display panel 10 in various shapes.

Figure 19:
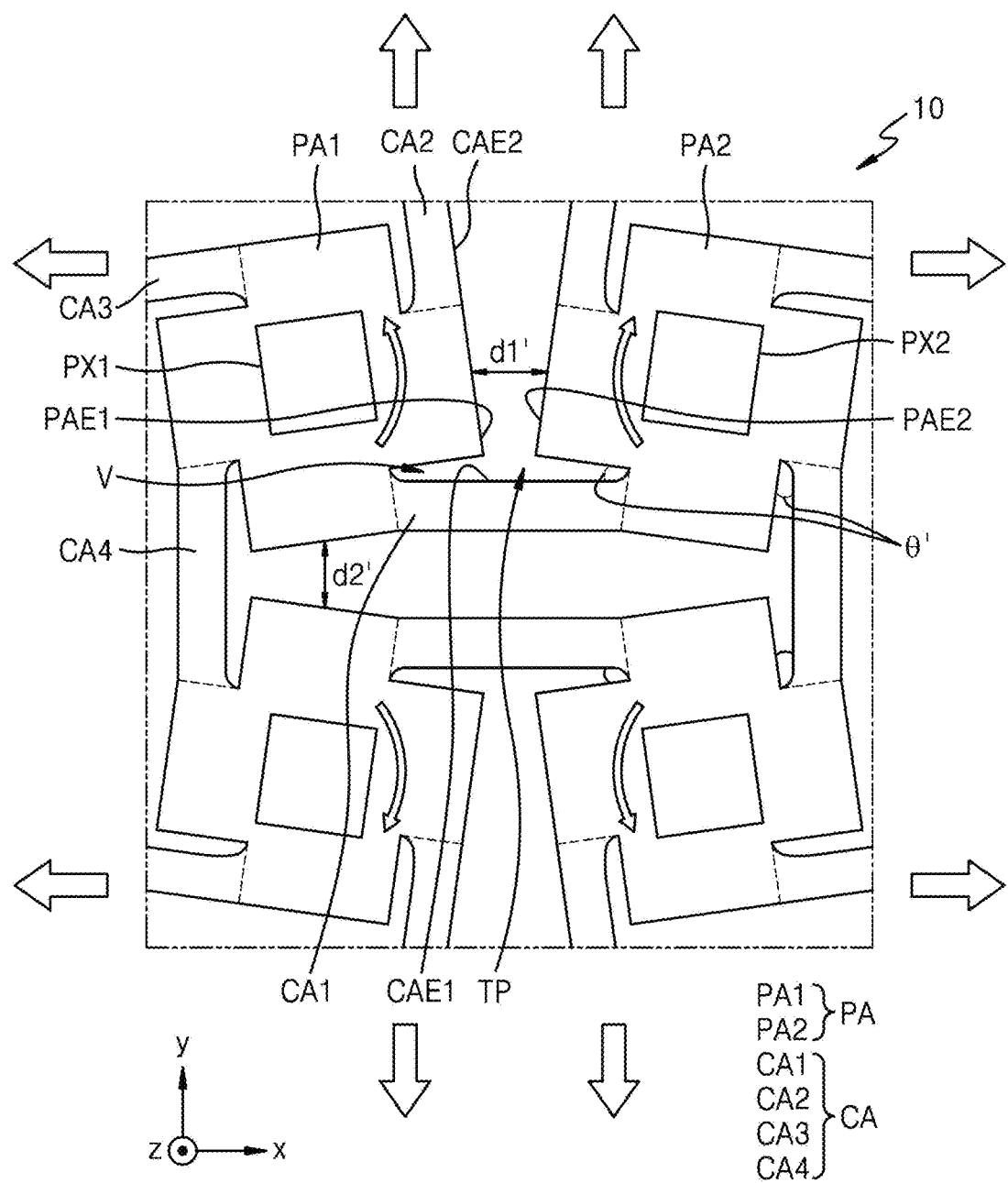
FIG. 19 is an enlarged view of a portion of a display area of a bent display panel, according to an embodiment.

FIG. 19 is an enlarged view of a portion of a display area of the display panel 10 in a bent state according to an embodiment. In FIG. 19, the same or like reference numerals as those of FIG. 10 denote the same or like elements, and any repetitive detailed descriptions thereof will be omitted.

Referring to FIG. 19, in an embodiment the through portion TP may be defined through the display panel 10. An element of the display panel 10 may not be arranged in the through portion TP. Thus, the display panel 10 may be stretched and/or contracted without being damaged.

In an embodiment, a shape of the through portion TP in the display panel 10 in a bent state may be changed. In the display panel 10 in a bent state, an angle θ' between the edge CAE1 of the first connection area CA1 and the edge PAE2 of the second pixel area PA2 may be changed, an area or shape of a space area V may be changed, and a position of the pixel area PA may also be changed.

Through the change in angle θ', the increase in area of the space area V, and/or the change in shape described above, each pixel area PA may rotate at a preset angle. By the rotation of each of the pixel areas PA, distances between the pixel areas PA, for example, a first distance d1' and a second distance d2', may differ for each position. In the display panel 10 in a bent state, a stress may be generated in the first direction (for example, the x direction or the −x direction), the second direction (for example, the y direction or the −y direction), and/or the third direction (for example, the z direction or the −z direction). In an embodiment where the through portion TP is defined through the display panel 10, a shape of the through portion TP in the display panel 10 in a bent state may be changed, and a stress in the first direction (for example, the x direction or the −x direction), the second direction (for example, the y direction or the −y direction), and/or the third direction (for example, the z direction or the −z direction) may decrease. Thus, the damage to the display panel 10 may be prevented or reduced.

Figure 20:
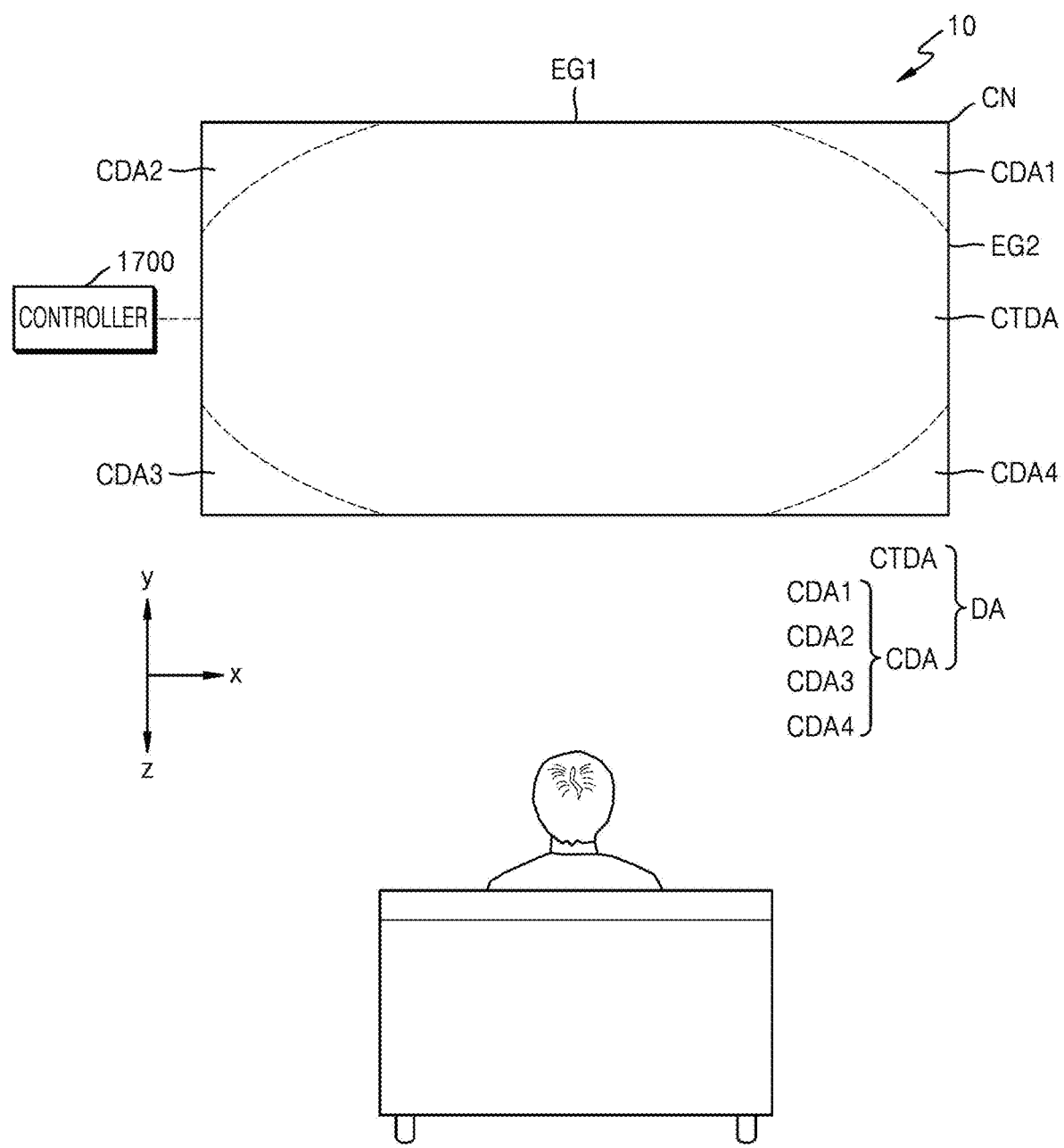
FIGS. 20, 21, and 22 are diagrams illustrating bending of a display panel in consideration of a user's position.
Figure 21:
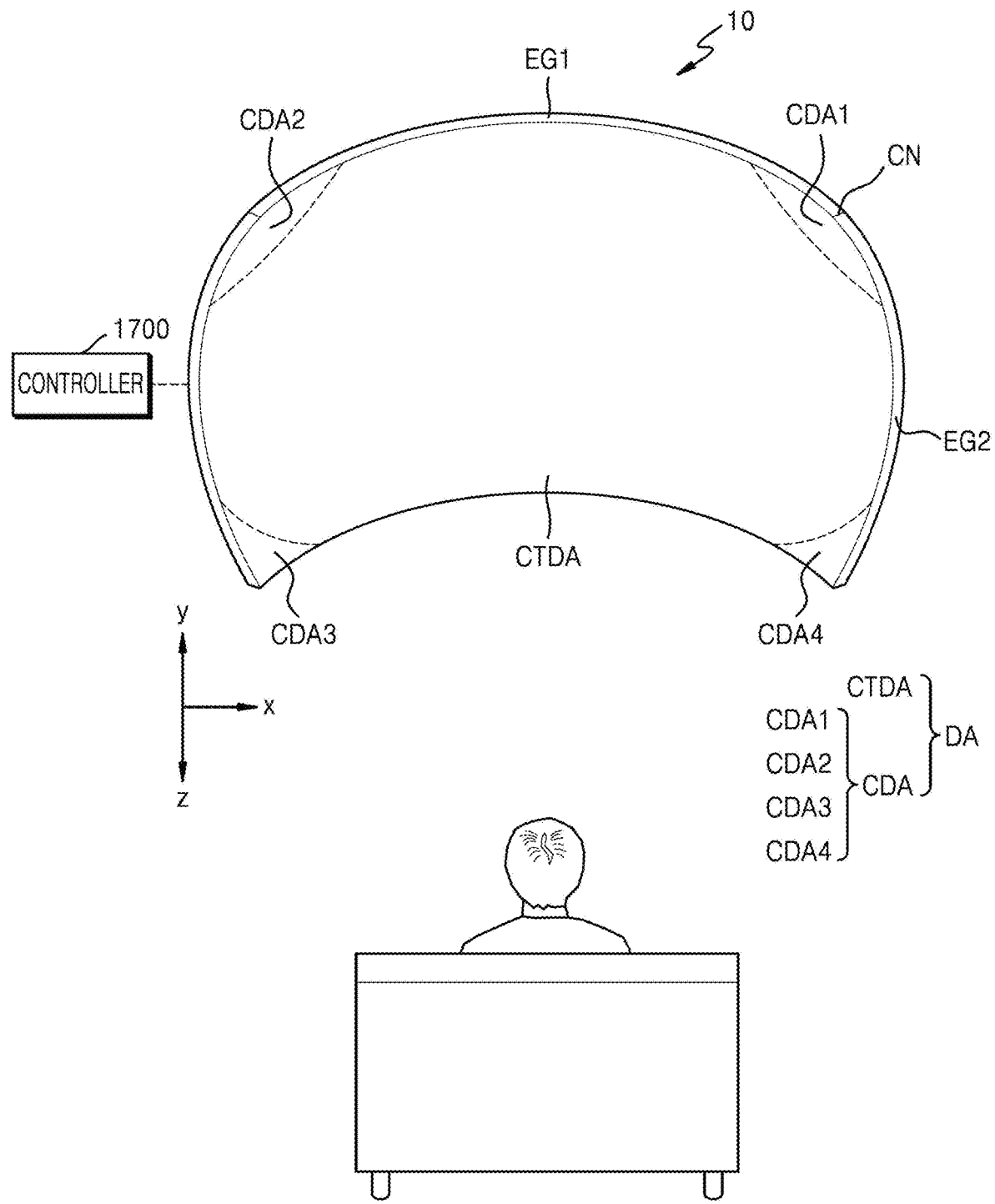
Figure 22:
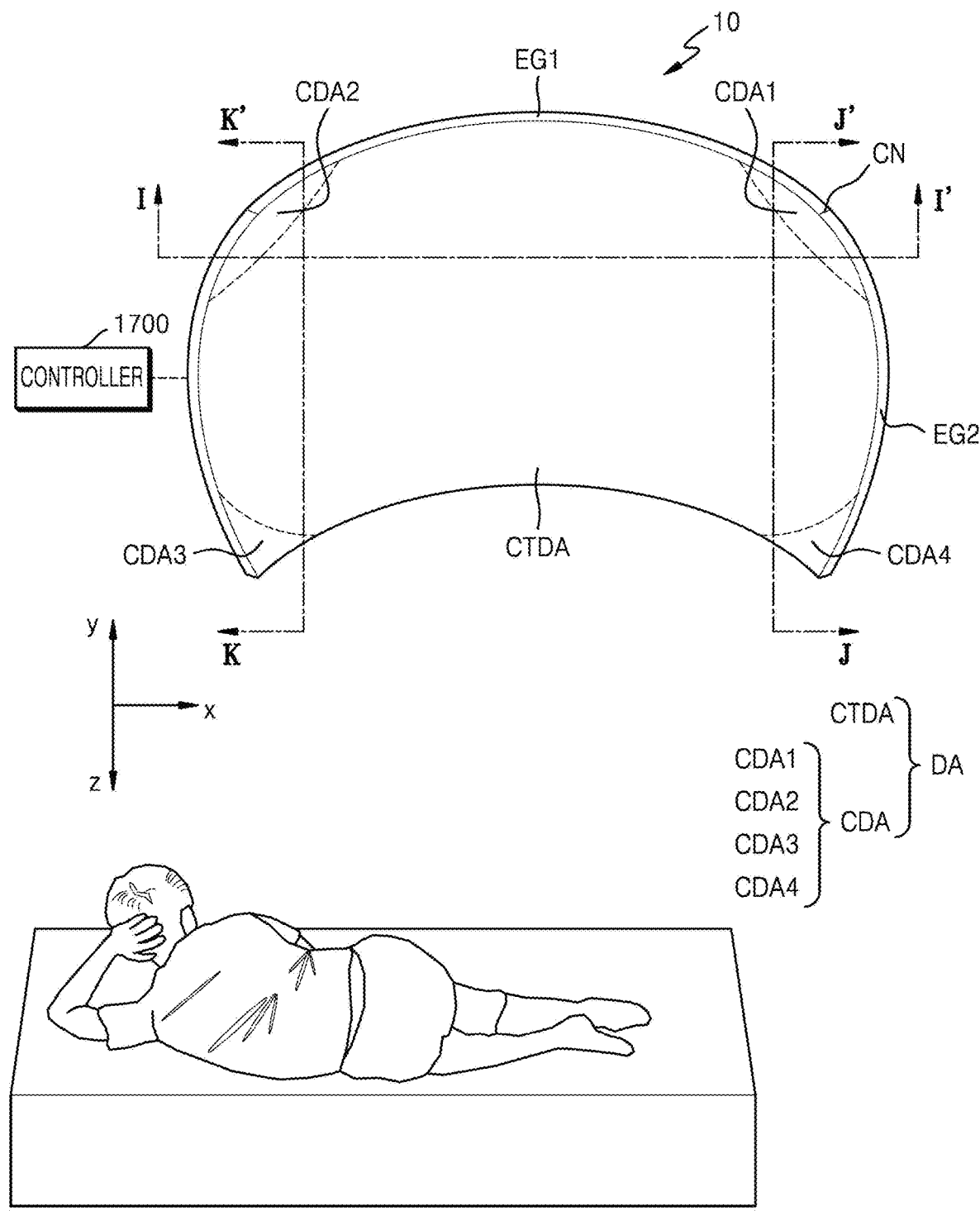
Figure 23A:
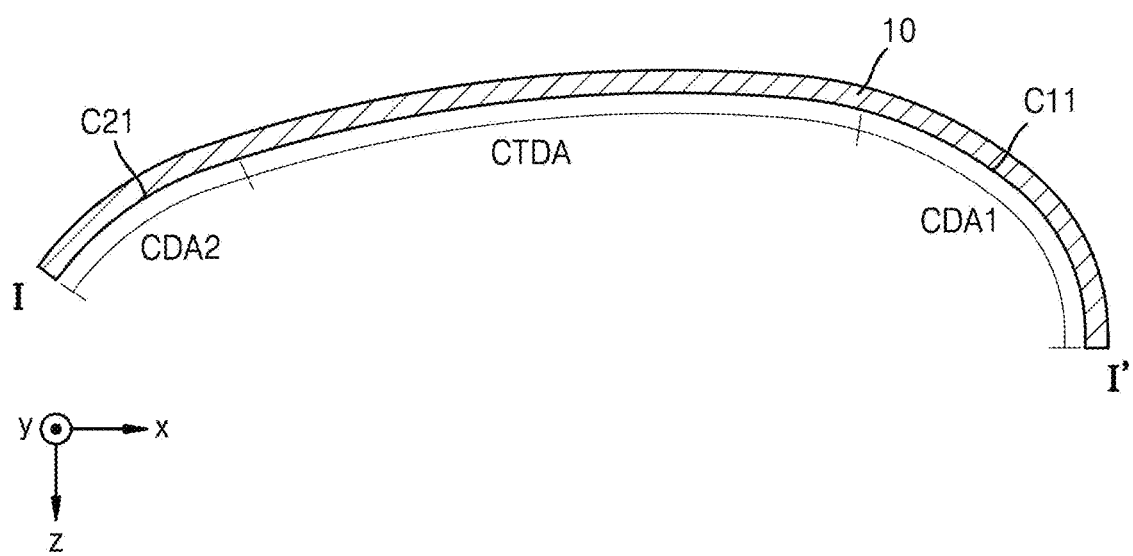
FIG. 23A is a cross-sectional view of the display panel in FIG. 22, taken along line I-I' in FIG. 22.
Figure 23B:
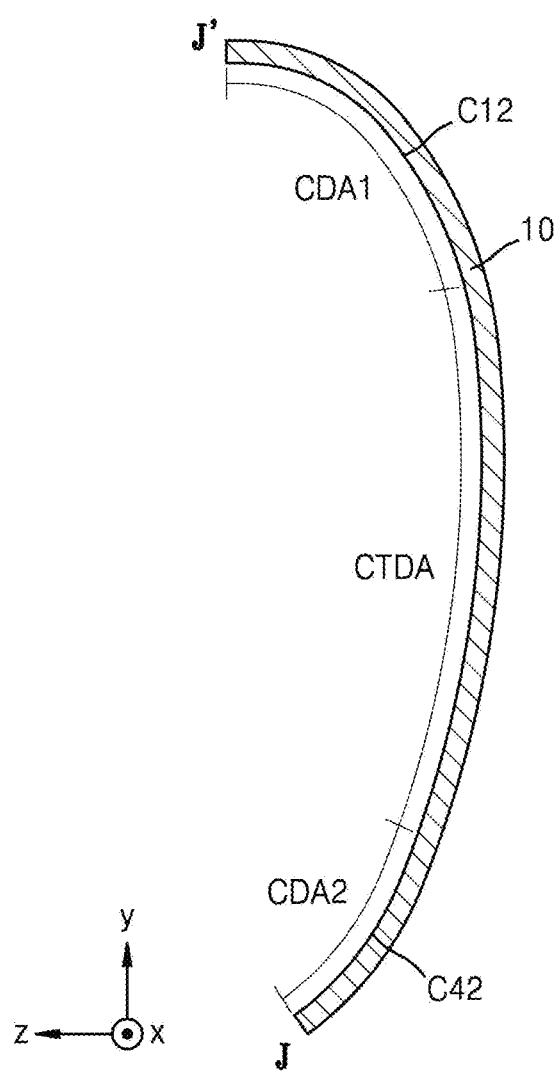
FIG. 23B is a cross-sectional view of the display panel in FIG. 22, taken along line J-J' in FIG. 22.
Figure 23C:
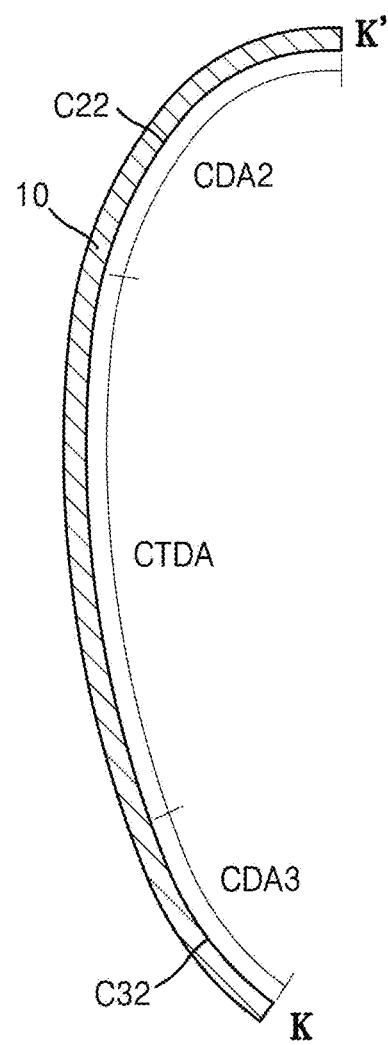
FIG. 23C is a cross-sectional view of the display panel in FIG. 22, taken along line K-K' in FIG. 22.

FIGS. 20, 21, and 22 are diagrams illustrating bending of the display panel 10 in consideration of a position of a user. FIG. 23A is a cross-sectional view of the display panel 10 in FIG. 22, taken along line I-I' in FIG. 22. FIG. 23B is a cross-sectional view of the display panel 10 in FIG. 22, taken along line J-J' in FIG. 22. FIG. 23C is a cross-sectional view of the display panel 10 in FIG. 22, taken along line K-K' in FIG. 22.

Referring to FIG. 20, an image may be displayed in the display area DA of the display panel 10. The display area DA may include the central display area CTDA and the corner display area CDA. The central display area CTDA may be arranged in the center of the display panel 10. The corner display area CDA may be arranged between the central display area CTDA and the corner CN where the edges of the display panel 10 meet.

The display panel 10 may include the plurality of corner display areas CDA. In one embodiment, for example, the display panel 10 may include the first corner display area CDA1, the second corner display area CDA2, the third corner display area CDA3, and the fourth corner display area CDA4.

The display panel 10 may include edges. In an embodiment, the display panel 10 may include the first edge EG1 extending in the first direction (for example, the x direction or the −x direction), and the second edge EG2 extending in the second direction (for example, the y direction or the −y direction).

The controller 1700 may obtain information to bend the display panel 10. The information obtained to bend the display panel 10 may include information about a position of at least one user. In an embodiment, a position of a user may be defined as a position of the head of the user with respect to the display panel 10.

In an embodiment, the position information of the at least one user may include position information of a single user. In an embodiment, the position information of the at least one user may include position information of a plurality of users.

In an embodiment, the controller 1700 may obtain information about the position of the user by using a position sensor of the display device 1. The position sensor may include, for example, a laser displacement sensor, an ultrasonic displacement sensor, etc.

Referring to FIGS. 21 and 22, the controller 1700 may bend the display panel 10 such that each of the first edge EG1 and the second edge EG2 has a curvature based on the information about the position of the user. In an embodiment, the controller 1700 may bend the display panel 10 to have a preset curvature of the first edge EG1 and a preset curvature of the second edge EG2 in consideration of information set by a user. In an embodiment, the display panel 10 may have a concave shape in the display panel 10 in a bent state.

Referring to FIGS. 22 and 23A to 23C, the position of the user may be changed. In an embodiment, the position of the user may be changed in the first direction (for example, the x direction or the −x direction) and/or the second direction (for example, the y direction or the −y direction). In one embodiment, for example, in FIG. 22, the position of the user is changed in the −x direction and the −y direction.

The controller 1700 may obtain information to bend the display panel 10. The controller 1700 may bend the display panel 10 such that each of the first edge EG1 and the second edge EG2 has a curvature based on the obtained information. In an embodiment, the controller 1700 may adjust a length of the first wire 21WR1 (see FIG. 17), a length of the second wire 21WR2 (see FIG. 17), a length of the third wire 21WR3 (see FIG. 17), and a length of the fourth wire 21WR4 (see FIG. 17) in an independent manner. Thus, the controller 1700 may bend the display panel 10 so that the display panel 10 has various shapes.

The corner display areas CDA may have a first-direction curvature on a cross-section (for example, the x-z cross-section) in the first direction (for example, the x direction or the −x direction), and a second-direction curvature on a cross-section (for example, the y-z cross-section) in the second direction (for example, the y direction or the −y direction).

In an embodiment, the first corner display area CDA1 may have the first-direction first-curvature C11 and the second-direction first-curvature C12. In an embodiment, the second corner display area CDA2 may have the first-direction second-curvature C21 and the second-direction second-curvature C22. In an embodiment, the third corner display area CDA3 may have the first-direction third-curvature and the second-direction third-curvature. In an embodiment, the fourth corner display area CDA4 may have the first-direction fourth-curvature and the second-direction fourth-curvature.

In an embodiment, a first-direction curvature of one of the plurality of corner display areas may be different from a first-direction curvature of the other one of the plurality of corner display areas. In one embodiment, for example, the first-direction first-curvature C11 of the first corner display area CDA1 may be different from the first-direction second-curvature C21 of the second corner display area CDA2. The first-direction first-curvature C11 of the first corner display area CDA1 may be greater than the first-direction second-curvature C21 of the second corner display area CDA2.

A second-direction curvature of one of the plurality of corner display areas may be different from a second-direction curvature of the other one of the plurality of corner display areas. In one embodiment, for example, the second-direction first-curvature C12 of the first corner display area CDA1 may be greater than a second-direction second-curvature C42 of the fourth corner display area CDA4. The second-direction second-curvature C22 of the second corner display area CDA2 may be greater than a second-direction second-curvature C32 of the third corner display area CDA3.

In an embodiment of the invention, the display panel 10 may be bent from the first direction (for example, the x direction or the −x direction) to the third direction (for example, the z direction or the −z direction), and may be bent from the second direction (for example, the y direction or the −y direction) to the third direction (for example, the z direction or the −z direction). In such an embodiment, the display panel 10 is a stretchable display panel that may be stretched and/or contracted such that the bending operations described above may be effectively performed.

In an embodiment, the controller 1700 may bend the display panel 10 in various shapes corresponding to obtained information. Thus, users viewing an image in the display area DA may be provided with various viewing experiences, and a screen distortion experienced by the user may be reduced.

In an embodiment, information obtained to bend the display panel 10 may include at least one of information corresponding to a manipulation of a remote controller connected to the display device, information corresponding to a voice signal of a user viewing an image, and information on a type of content included in the image along with position information of at least one user viewing the image. In such an embodiment, the controller 1700 may bend the display panel 10 so that each of the first edge EG1 and the second edge EG2 has a curvature based on the obtained information.

In embodiments of the invention, as described above, the display device may include a frame set for bending a display panel. Thus, the display panel may be bent without being damaged.

In such embodiments, the user viewing the image may be provided with various viewing experiences, and a screen distortion experienced by the user with respect to an image displayed in the display device may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel;
   a frame set which bends the display panel;
   wherein the frame set comprises
   a frame including a body and a head protruding toward the display panel from the body,
   an intermediate frame facing the frame and disposed between the frame and the display panel, and
   a wire extending within the interior of the frame,
   wherein the intermediate frame is spaced apart from the body of the frame and connected to the head of the frame,
   wherein the wire is in a linear straight shape when the display panel is in an unbent state, and
   wherein the wire is in a curved shape when the display panel is in a bent state.

2. The display device of claim 1, wherein
the frame further includes a protrusion pattern protruding toward the display panel from the body, the protrusion pattern is apart from the head,
a through hole is defined through the protrusion pattern, and the wire extends through the through hole.

3. The display device of claim 1, wherein
the intermediate frame moves relative to the head.

4. The display device of claim 3, wherein
one of the head and the intermediate frame comprises a concave portion facing the other one of the head and the intermediate frame, and
the other one of the head and the intermediate frame comprises a convex portion facing the concave portion.

5. The display device of claim 1,
wherein the display panel includes a structure and/or material that is stretchable and/or contractible in at least a portion.

6. The display device of claim 5,
the display panel comprises
pixel areas spaced apart from one another, and
connection areas connecting the pixel areas.

7. The display device of claim 6,
wherein connection areas include a plurality of connection areas extending in different direction from one of pixel areas, each of the plurality of connection areas is connected to another pixel area adjacent to the one pixel area.

8. The display device of claim 7,
wherein the display panel further comprises through-portions surrounded and defined by the plurality of connection areas and the pixel areas.

9. The display device of claim 8,
wherein the display panel comprises a substrate, a pixel circuit layer, a display element layer, and an encapsulation layer, the substrate, the pixel circuit layer, the display element layer, and the encapsulation layer are separated with the through-portion therebetween.

10. The display device of claim 9,
wherein the display panel comprises a first pixel area and a second pixel area separated with the through-portion therebetween,
the first pixel area and the second pixel area comprise a first dam portion and a second dam portion, respectively, disposed adjacent to the through-portion.

* * * * *